(12) United States Patent
Xie et al.

(10) Patent No.: US 12,557,354 B2
(45) Date of Patent: Feb. 17, 2026

(54) VERTICAL FIELD-EFFECT TRANSISTOR (FET) STACKED OVER HORIZONTAL FET

(71) Applicant: INTERNATIONAL BUSINESS MACHINES CORPORATION, Armonk, NY (US)

(72) Inventors: Ruilong Xie, Niskayuna, NY (US); Heng Wu, Santa Clara, CA (US); Julien Frougier, Albany, NY (US); Min Gyu Sung, Latham, NY (US)

(73) Assignee: International Business Machines Corporation, Armonk, NY (US)

( * ) Notice: Subject to any disclaimer, the term of this patent is extended or adjusted under 35 U.S.C. 154(b) by 761 days.

(21) Appl. No.: 17/664,082

(22) Filed: May 19, 2022

(65) Prior Publication Data

US 2023/0378259 A1    Nov. 23, 2023

(51) Int. Cl.
*H10D 62/10* (2025.01)
*H10D 30/01* (2025.01)
(Continued)

(52) U.S. Cl.
CPC ......... *H10D 62/118* (2025.01); *H10D 30/031* (2025.01); *H10D 30/6713* (2025.01); *H10D 30/6735* (2025.01); *H10D 30/6757* (2025.01); *H10D 64/017* (2025.01); *H10D 84/0128* (2025.01); *H10D 84/013* (2025.01); *H10D 84/038* (2025.01)

(58) Field of Classification Search
CPC ............... H10D 62/118; H10D 30/031; H10D 30/6713; H10D 30/6735; H10D 30/6757; H10D 64/017; H10D 84/0128; H10D 84/013; H10D 84/038
See application file for complete search history.

(56) References Cited

U.S. PATENT DOCUMENTS 5,308,778 A    5/1994   Fitch
9,595,535 B1   3/2017   Ogawa
(Continued)

OTHER PUBLICATIONS

Ryckaert et al., "The Complementary FET (CFET) for CMOS scaling beyond N3," Symposium on VLSI Technology, 2018, pp. 141-142.

*Primary Examiner* — Christine S. Kim
*Assistant Examiner* — Nathalie R Fayette
(74) *Attorney, Agent, or Firm* — Edward J. Wixted, III

(57) ABSTRACT

Embodiments of the invention include a method for fabricating a semiconductor device and the resulting structure. A nanosheet stack of alternating nanosheets of a sacrificial semiconductor material nanosheet and a semiconductor channel material nanosheet and adjacent source/drain regions are provided, where a dummy gate having a gate cut straddles over the nanosheet stack. A semiconductor layer is wafer bonded. A fin is patterned in the semiconductor layer. A source/drain region is formed. A spacer is formed on the bottom source/drain region. A dummy gate is formed on sidewalls of a portion of the fin. A source/drain region is formed. A trench is formed that passes through one dummy gate to the other dummy gate. The dummy gates are removed. Each sacrificial semiconductor material nanosheet is removed. Functional gate structures are formed in regions occupied by the dummy gates and each sacrificial semiconductor material nanosheet.

10 Claims, 27 Drawing Sheets

(51) Int. Cl.
*H10D 30/67* (2025.01)
*H10D 64/01* (2025.01)
*H10D 84/01* (2025.01)
*H10D 84/03* (2025.01)

(56) References Cited

U.S. PATENT DOCUMENTS

| | | |
|---|---|---|
| 9,659,963 B2 | 5/2017 | Cheng |
| 9,837,414 B1 | 12/2017 | Balakrishnan |
| 10,192,819 B1 | 1/2019 | Chanemougame |
| 10,192,867 B1 | 1/2019 | Frougier |
| 10,256,158 B1 | 4/2019 | Frougier |
| 10,510,622 B1 | 12/2019 | Frougier |
| 11,158,544 B2 | 10/2021 | Cheng |
| 11,201,093 B2 | 12/2021 | Veloso |
| 11,217,493 B2 | 1/2022 | Zhu |
| 11,282,838 B2 * | 3/2022 | Zhang ............... H10D 30/031 |
| 2020/0035829 A1 | 1/2020 | Do |
| 2021/0242202 A1 | 8/2021 | Do |
| 2024/0203991 A1 * | 6/2024 | Mochizuki ........... H10D 88/01 |

* cited by examiner

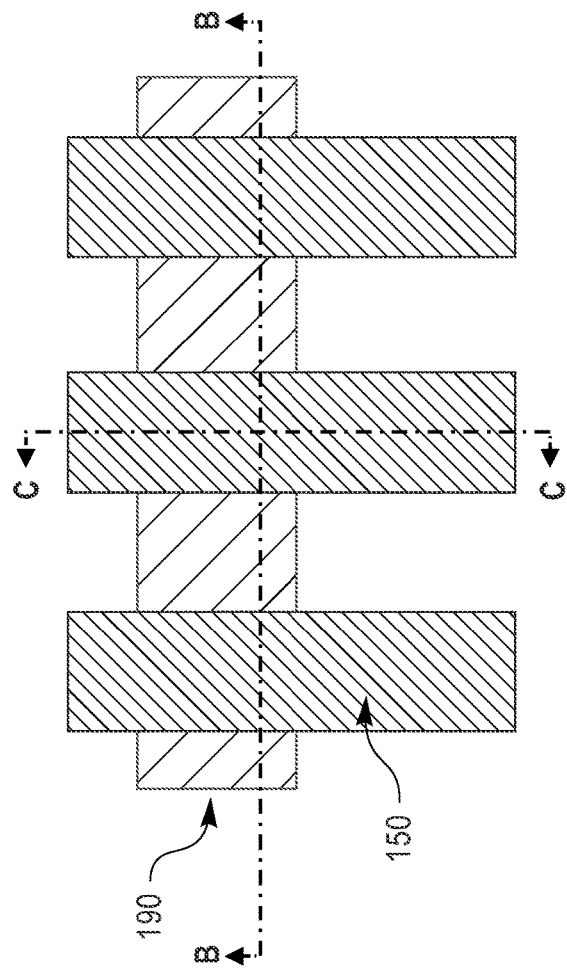
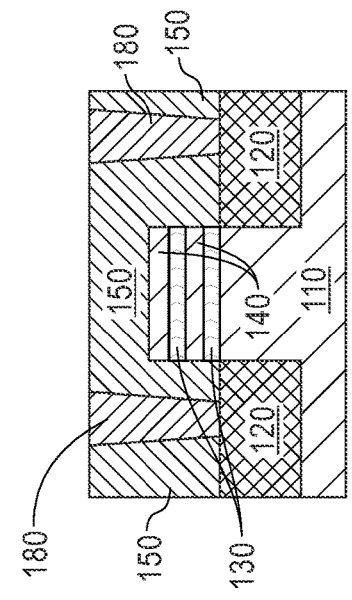
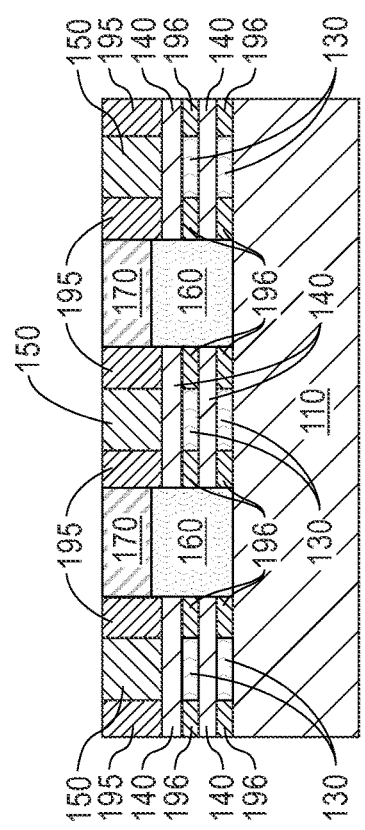
FIG. 1A
FIG. 1B
FIG. 1C

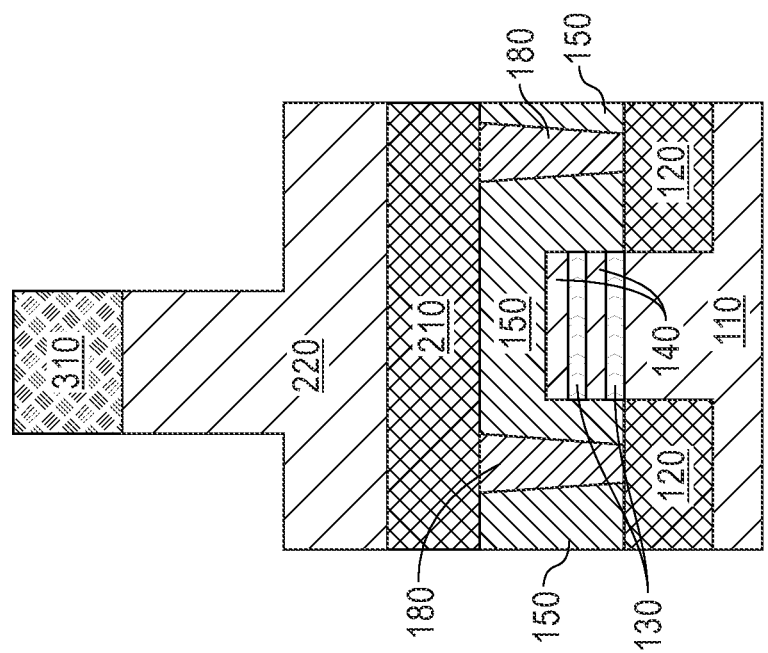
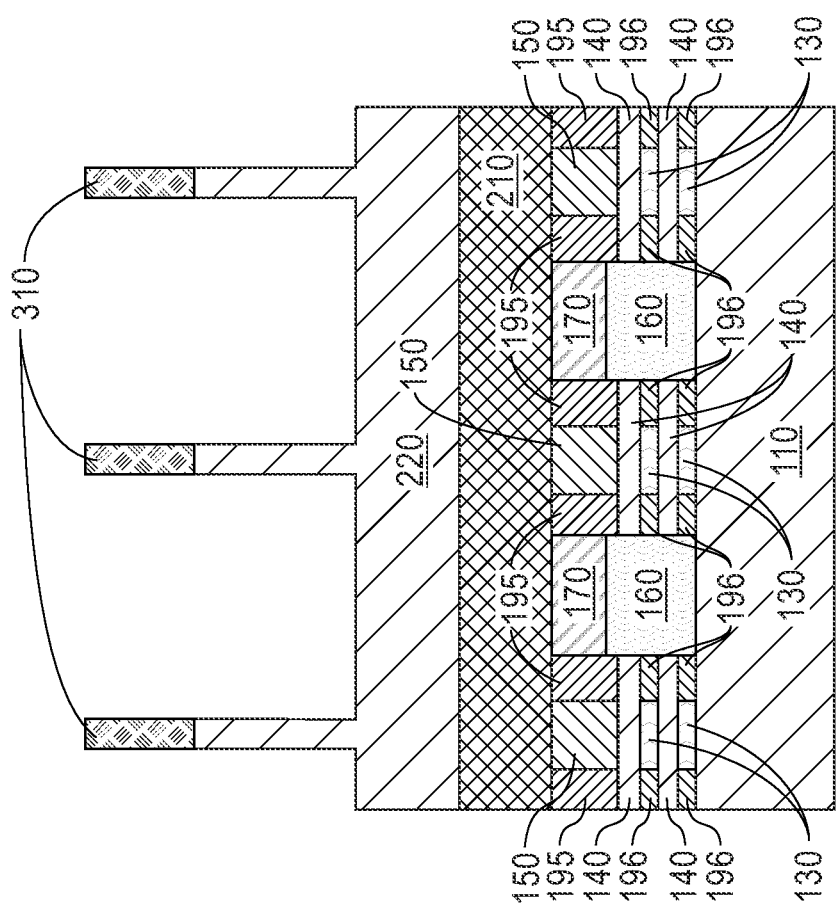
FIG. 3C
FIG. 3B

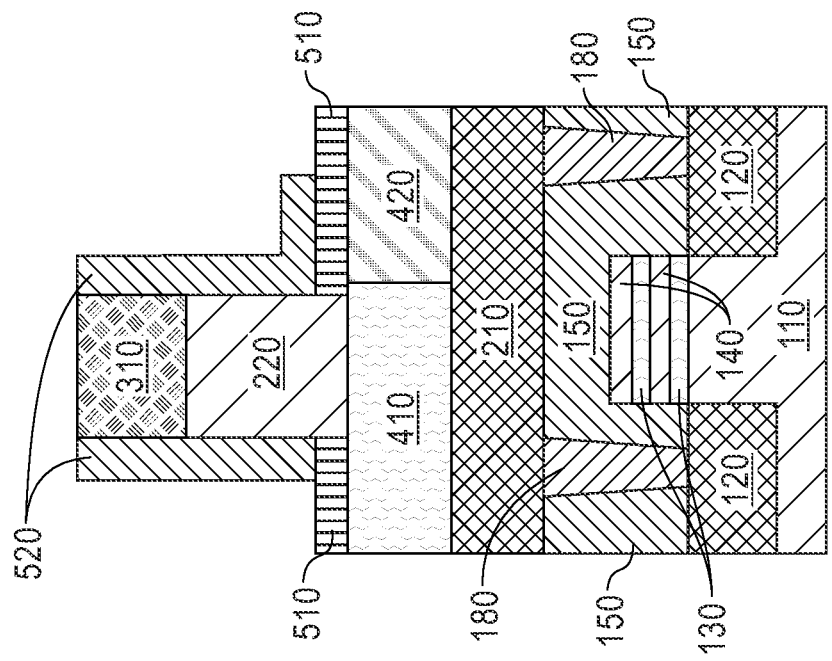
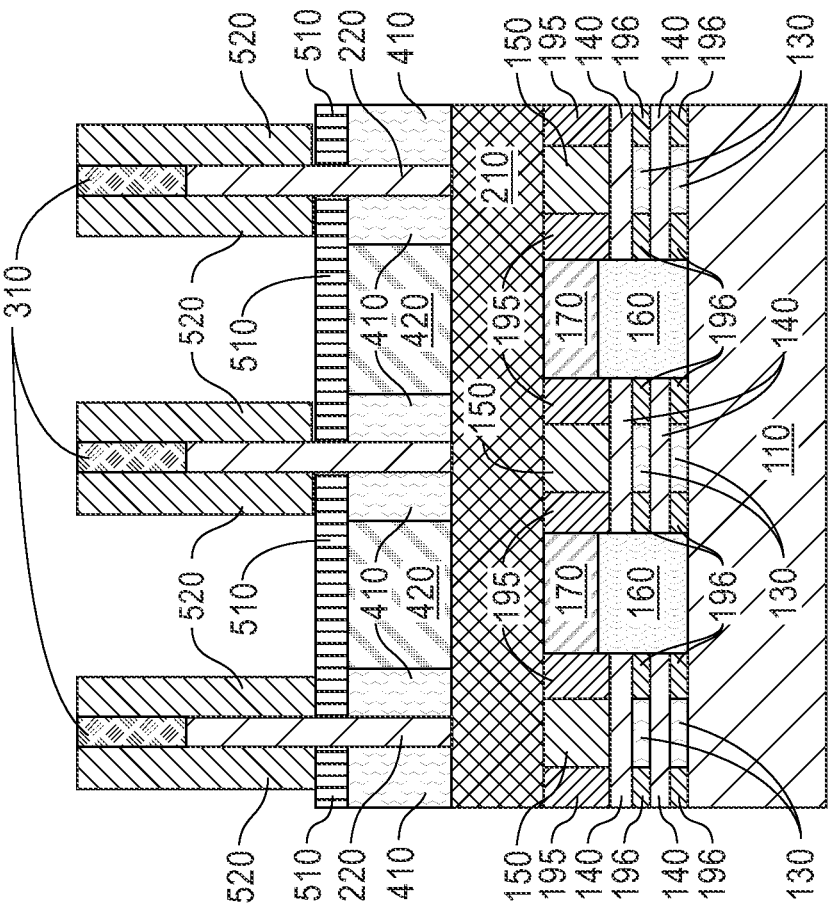
FIG. 5C
FIG. 5B

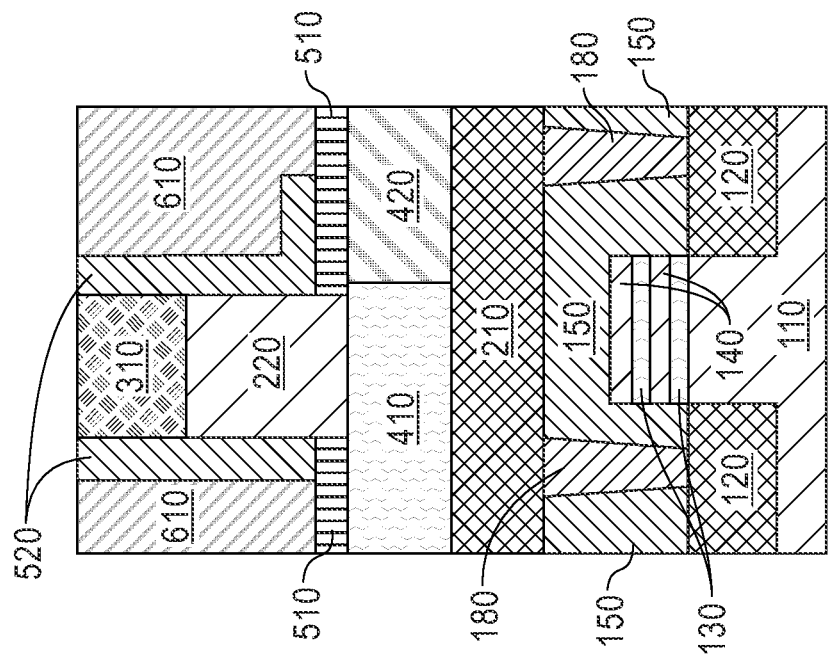
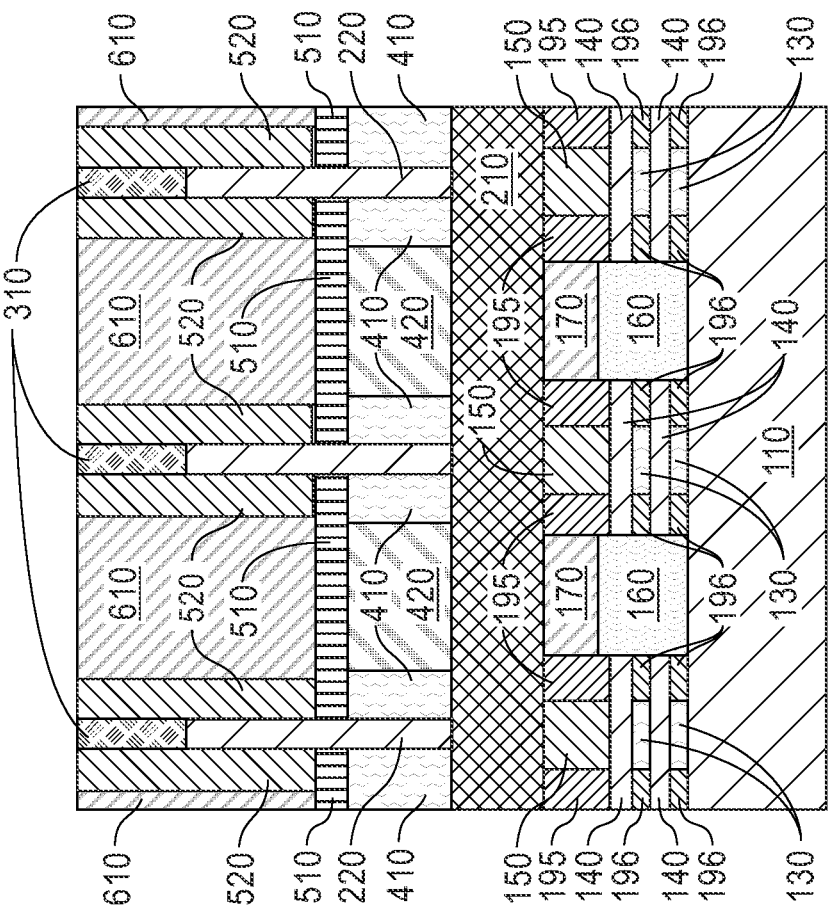

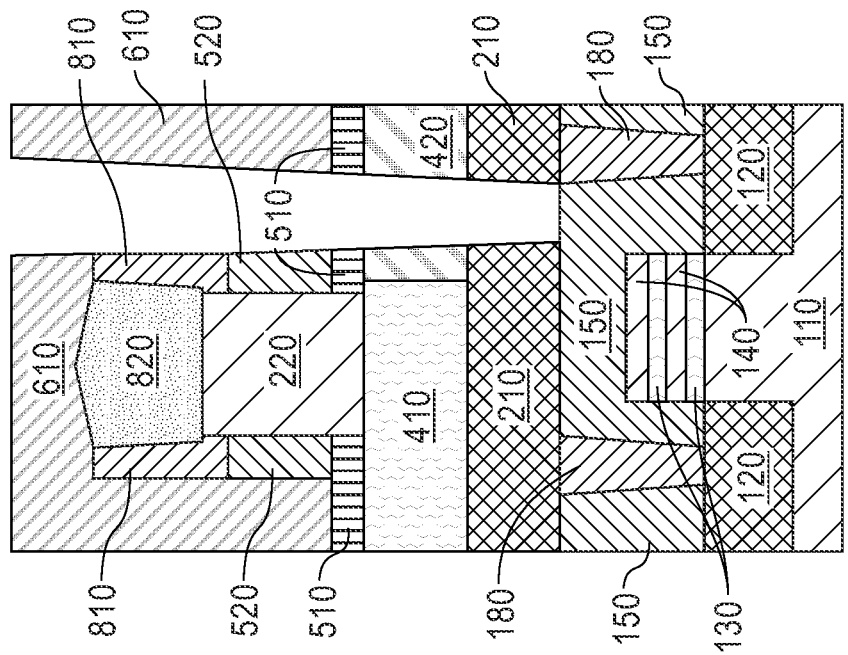
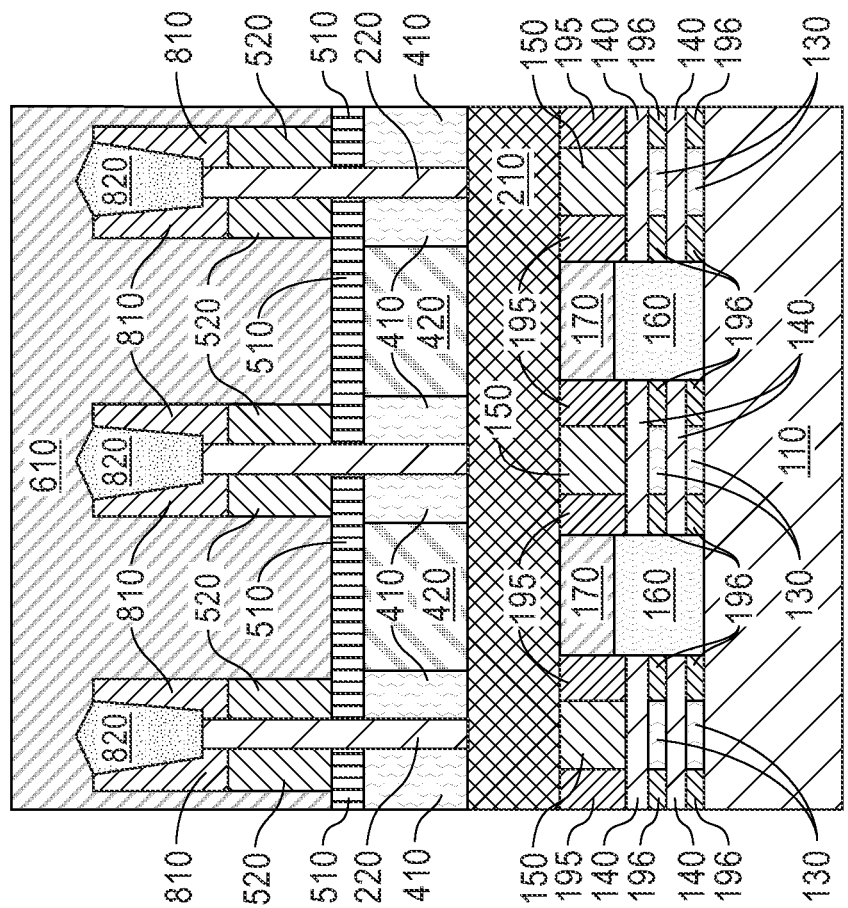
FIG. 10C
FIG. 10B

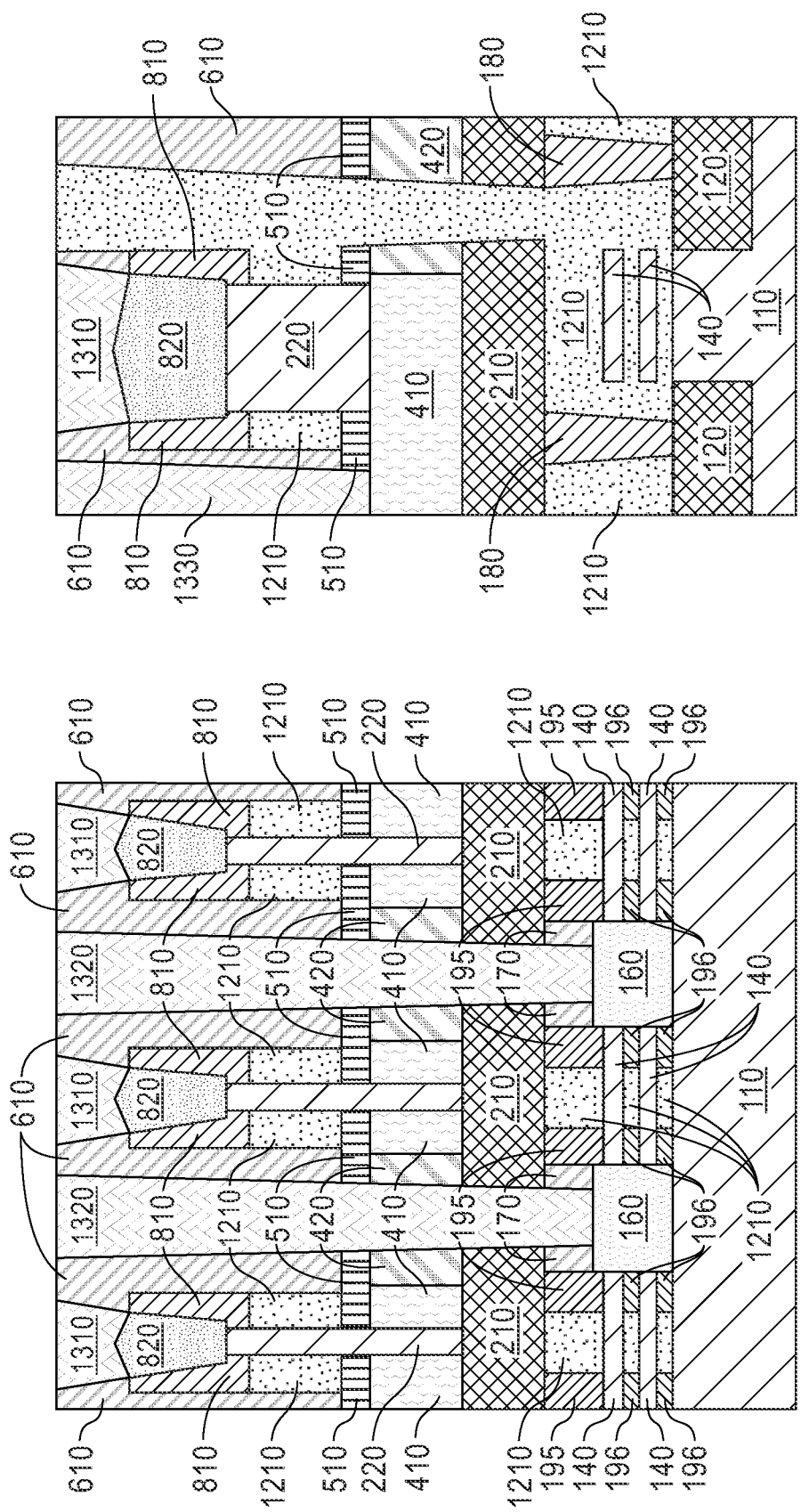

VERTICAL FIELD-EFFECT TRANSISTOR (FET) STACKED OVER HORIZONTAL FET

BACKGROUND

The present invention relates generally to the field of semiconductor devices and fabrication, and more particularly to stacked integrated circuit structures containing field-effect transistors (FETs) having a vertical transistor above a horizontal transistor.

Vertical-Transport Field Effect Transistors (VTFETs) layer transistors perpendicular to a silicon wafer and direct current flow vertical to the wafer's surface. In contrast, traditional FETs layer transistors along a wafer's surface.

The use of non-planar semiconductor devices such as, for example, semiconductor fin field effect transistors (FinFETs) is the next step in the evolution of complementary metal oxide semiconductor (CMOS) devices. One type of non-planar semiconductor device that has been touted as a viable option beyond the 7 nm technology node is a nanosheet containing device. By "nanosheet containing device" it is meant that the device contains one or more layers of semiconductor channel material portions having a vertical thickness that is substantially less than its width.

Nanosheet formation relies on the selective removal of one semiconductor material (e.g., silicon) to another semiconductor material (e.g., a silicon germanium alloy) to form suspended nanosheets for gate-all-around devices. Source/drain (S/D) regions for nanosheet containing devices are currently formed by epitaxial growth of a semiconductor material upwards from an exposed surface of the semiconductor substrate and from sidewalls of each nanosheet.

SUMMARY

Embodiments of the invention include a method for fabricating a semiconductor device and the resulting structure. The method includes providing (i) a nanosheet stack of alternating nanosheets of a sacrificial semiconductor material nanosheet and a semiconductor channel material nanosheet and (ii) source/drain regions adjacent to the nanosheet stack, where a first dummy gate straddles over the nanosheet stack, the first dummy gate having at least one trench filled with dielectric material forming a gate cut. The method can also include wafer bonding a semiconductor layer to exposed topmost surfaces. The method can also include patterning a fin in the semiconductor layer. The method can also include forming a bottom source/drain region, the bottom source/drain region surrounding a first portion of the fin. The method can also include forming a first spacer on the bottom source/drain region. The method can also include forming a second dummy gate on sidewalls of a second portion of the fin. The method can also include forming an upper source/drain region, a bottom surface of the upper source/drain region contacting a top surface of the semiconductor layer. The method can also include forming a trench that passes through the second dummy gate an exposes a top surface of the first dummy gate. The method can also include removing the first dummy gate and the second dummy gate. The method can also include removing each sacrificial semiconductor material nanosheet to suspend each semiconductor channel material nanosheet. The method can also include forming a first functional gate structure in regions occupied by the first dummy gate and each sacrificial semiconductor material nanosheet, a second functional gate structure in regions occupied by the second dummy gate, where the first functional gate structure wraps around each suspended semiconductor channel material nanosheet.

BRIEF DESCRIPTION OF THE DRAWINGS

FIG. 1A depicts a top-down view, FIG. 1B depicts a cross-sectional view, along section line B of FIG. 1A, and FIG. 1C depicts a cross-sectional view, along section line C of FIG. 1A, of a device at an early stage in the method of forming the device, the device including a semiconductor substrate and semiconductor material stack upon which embodiments of the present invention can be fabricated, in accordance with an embodiment of the invention.

FIG. 3B depicts a cross-sectional view, along section line B of FIG. 3A, and FIG. 3C depicts a cross-sectional view, along section line C of FIG. 3A, of a process patterning a hardmask and forming fins within the semiconductor layer, in accordance with an embodiment of the present invention.

FIG. 5B depicts a cross-sectional view, along section line B of FIG. 5A, and FIG. 5C depicts a cross-sectional view, along section line C of FIG. 5A, of a process of forming a bottom spacer and forming and patterning a sacrificial gate structure, in accordance with an embodiment of the present invention.

FIG. 6B depicts a cross-sectional view, along section line B of FIG. 6A, and FIG. 6C depicts a cross-sectional view, along section line C of FIG. 6A, of a process of forming interlevel dielectric (ILD) material, in accordance with an embodiment of the present invention.

FIG. 10B depicts a cross-sectional view, along section line B of FIG. 10A, and FIG. 10C depicts a cross-sectional view, along section line C of FIG. 10A, of a process of patterning and forming contact tranches, in accordance with an embodiment of the present invention.

FIG. 13B depicts a cross-sectional view, along section line B of FIG. 13A, and FIG. 13C depicts a cross-sectional view, along section line C of FIG. 13A, of a process of forming Vertical-Transport Field Effect Transistor (VTFET) top source/drain contacts, bottom FET source/drain contacts, and VTFET bottom source/drain contacts, in accordance with an embodiment of the present invention.

DETAILED DESCRIPTION

Figure 2A:
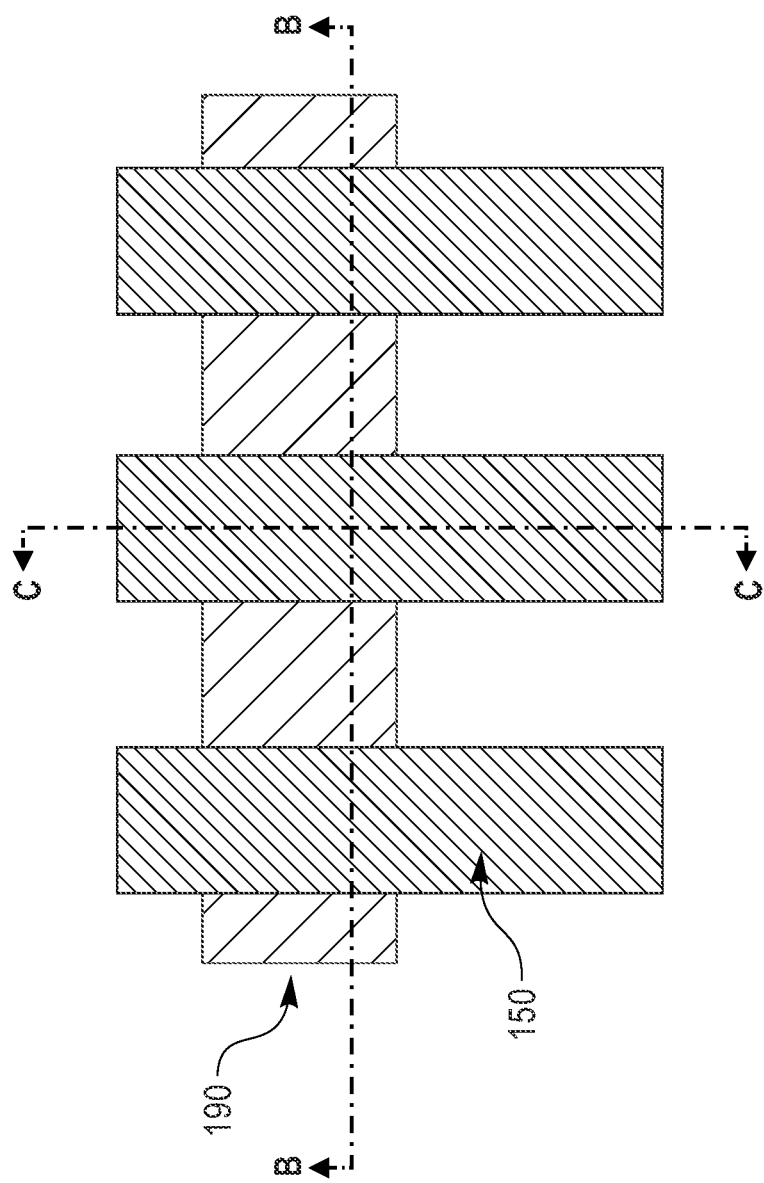
FIG. 2A depicts a top-down view.

Embodiments of the present invention recognize that conventional stacked complementary field-effect transistor (CFET) devices have a source/drain epitaxy of one device on top of the other device and that such an approach leads to two issues: (1) it is difficult to form a contact to the bottom source/drain epitaxy, requiring either (i) extending the bottom source/drain epitaxial growth, which is defective with high resistance or (ii) a replacement contact extension formation, which could result in a high contact resistance ($R_c$); and (2) a coupling effect between the top source/drain epitaxy and bottom source/drain contact could slow down the device. Embodiments of the present invention further recognize that key challenges of stack FET middle-of-line (MOL) architectures are associated with spacing concerning, for example, tip-to-tip (T2T), bottom source/drain contact to top source/drain epitaxy short, and small bottom source/drain contact size.

Embodiments of the present invention describe an approach for fabricating a semiconductor device, the approach including forming bottom horizontal transistors, wafer bonding top channel materials over the bottom horizontal transistors, forming top vertical transistors, and forming contacts for both top and bottom transistors. Embodiments of the present invention describe a semiconductor device that includes at least a vertical transistor stack over another horizontal transistor. Embodiments of the present invention further describe a semiconductor device where the source/drain epitaxy of the horizontal transistor does not overlap with the source/drain epitaxy of the vertical transistor such that an MOL contact can directly land over all source/drain epitaxies for both top and bottom devices. Embodiments of the present invention recognize that such an approach and the resulting semiconductor device better facilitates MOL contact placement when compared to a device that uses a horizontal transistor over a horizontal transistor.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

References in the specification to "one embodiment," "an embodiment," "an example embodiment," etc., indicate that the embodiment described may include a particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "right," "left," "vertical," "horizontal," "top," "bottom," and derivatives thereof shall relate to the disclosed structures and methods, as oriented in the drawing Figures. The terms "overlaying," "atop," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Each reference number may refer to an item individually or collectively as a group. For example, source/drain region 160 may refer to a single source drain region 160 or multiple source/drain regions 160.

FIGS. 1A, 2A, 3A, 4A, 5A, 6A, 7A, 8A, 9A, 10A, 11A, 12A, 13A, and 14A are simplified depictions of the device and are provided primarily to establish a frame of reference for the presence of the cross-sectional views of the other Figures. Accordingly, many objects and features that are present in the cross-sectional views are not depicted in FIGS. 1A, 2A, 3A, 4A, 5A, 6A, 7A, 8A, 9A, 10A, 11A, 12A, 13A, and 14A The present invention will now be described in detail with reference to the Figures.

FIG. 1A depicts a top-down view of a device at an early stage in the method of forming the device, FIG. 1B depicts a cross-sectional view along section line B of FIG. 1A and FIG. 1C depicts a cross-sectional view along section line C of FIG. 1A, in accordance with an embodiment of the present invention.

The semiconductor structure of FIGS. 1A-1C includes a semiconductor substrate upon which embodiments of the invention can be fabricated. FIG. 1A generally shows the location of sacrificial gate structure 150 and bottom active device area (RX) 190 Semiconductor substrate 110 may be composed of a silicon containing material. Silicon containing materials include, but are not limited to, silicon, single crystal silicon, polycrystalline silicon, SiGe, single crystal SiGe, polycrystalline SiGe, or silicon doped with carbon (C), amorphous silicon, and combinations and multi-layers thereof. Semiconductor substrate 110 can also be composed of other semiconductor materials, such as germanium (Ge), and compound semiconductor substrates, such as type III/V semiconductor substrates, e.g., gallium arsenide (GaAs). In general, semiconductor substrate 110 is a smooth surface substrate. In some embodiments (not shown), semiconductor substrate 110 can be a partially processed complementary metal-oxide semiconductor (CMOS) integrated wafer with transistors and wiring levels or gate electrodes embedded beneath the surface.

A semiconductor material stack (130, 140) is formed upon semiconductor substrate 110. The semiconductor material stack includes vertically aligned alternating layers of sacrificial semiconductor material layer 130 and semiconductor channel material layer 140. The semiconductor material stack is sequentially formed upon semiconductor substrate 110. As mentioned above, the semiconductor material stack includes sacrificial semiconductor material layers 130 and semiconductor channel material layers 140, which alternate one atop the other. In FIG. 1, and only by way of one example, the semiconductor material stack includes two layers of sacrificial semiconductor material layer 130 and two layers of semiconductor channel material layer 140. The semiconductor material stacks that can be employed in embodiments of the present invention are not limited to the specific embodiment illustrated in FIGS. 1A-1C. Instead, the semiconductor material stack can include any number of sacrificial semiconductor material layers 130 and semiconductor channel material layers 140. The semiconductor material stack is used to provide a gate-all-around device that includes vertically stacked semiconductor channel material nanosheets for a p-channel field-effect transistor (pFET) or n-channel field-effect transistor (nFET) device. It should be noted that while the depicted embodiment uses a nanosheet device for the bottom device, the bottom device can be any kind of non-vertical or horizontal device, such as, for example, fin field-effect transistor (FinFET), planar FET, nanowire, or extremely-thin silicon-on-insulator (ETSOI).

Each sacrificial semiconductor material layer 130 is composed of a first semiconductor material which differs in composition from at least an upper portion of semiconductor substrate 110. In one embodiment, the upper portion of the semiconductor substrate 110 is composed of silicon, while each sacrificial semiconductor material layer 130 is composed of silicon germanium. In such an embodiment, the silicon germanium alloy content of sacrificial semiconductor material layer 130 may have a germanium content that is less than fifty atomic percent germanium. In one example, the SiGe alloy that makes up sacrificial semiconductor material layer 130 has a germanium content from twenty atomic percent germanium to forty atomic percent germanium. The first semiconductor material, for each sacrificial semiconductor material layer 130, can be formed utilizing an epitaxial growth or deposition process.

Each semiconductor channel material layer 140 is composed of a second semiconductor material that has a different etch rate than the first semiconductor material of sacrificial semiconductor material layers 130. The second semiconductor material of each semiconductor channel material layer 140 may be the same as, or different than, the semiconductor material of, at least, the upper portion of semiconductor substrate 110. The second semiconductor material can be, for example, silicon. The second semiconductor material can be a SiGe alloy having a germanium content of twenty to fifty atomic percent germanium and the first semiconductor material is different than the second semiconductor material.

In one example, at least the upper portion of semiconductor substrate 110 and each semiconductor channel material layer 140 is composed of Si or a III-V compound semiconductor, while each sacrificial semiconductor material layer 130 is composed of a SiGe alloy. The second semiconductor material, for each semiconductor channel material layer 140, can be formed utilizing an epitaxial growth or deposition process.

Semiconductor material stack (130, 140) can be formed by sequential epitaxial growth of alternating layers of the first semiconductor material and the second semiconductor material. Following epitaxial growth of the topmost layer of the semiconductor material stack (130, 140) a patterning process may be used to provide the semiconductor material stack (130, 140) shown in FIGS. 1A-1C. Patterning may be achieved by lithography and etching as is well known to those skilled in the art. After the patterning process, a shallow trench isolation (STI) material 120 is formed by dielectric deposition, CMP, and recess.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth the first and second semiconductor materials that provide the sacrificial semiconductor material layers 130 and the semiconductor channel material layers 140, respectively, can be performed utilizing any well-known precursor gas or gas mixture. Carrier gases like hydrogen, nitrogen, helium and argon can be used.

The sacrificial semiconductor material layers 130 that constitutes the semiconductor material stack may have a thickness from five nm to twelve nm, while the semiconductor channel material layers 140 that constitute the semiconductor material stack may have a thickness from six nm to twelve nm. Each sacrificial semiconductor material layer 130 may have a thickness that is the same as, or different from, a thickness of each semiconductor channel material layer 140. In an embodiment, each sacrificial semiconductor material layer 130 has an identical thickness. In an embodiment, each semiconductor channel material layer 140 has an identical thickness.

Sacrificial gate structure 150 and dielectric spacer material layers may be formed. Each sacrificial gate structure 150 is located on a first side and a second side of the semiconductor material stack (130,140) and spans across a topmost surface of a portion of the semiconductor material stack (130, 140). Each sacrificial gate structure 150 thus straddles over a portion of the semiconductor material stack (130, 140). The dielectric spacer material layer is present on sidewalls of each sacrificial gate structure; the dielectric spacer material layer thus also straddles over the semiconductor material stack (130, 140).

Each sacrificial gate structure 150 may include a single sacrificial material portion or a stack of two or more sacrificial material portions (i.e., at least one sacrificial material portion). In one embodiment, the at least one sacrificial material portion comprises, from bottom to top, a sacrificial gate dielectric portion, a sacrificial gate portion and a sacrificial dielectric cap portion. In some embodiments, the sacrificial gate dielectric portion and/or the sacrificial dielectric cap portion can be omitted and only a sacrificial gate portion is formed. The at least one sacrificial material portion can be formed by forming a blanket layer (or layers) of a material (or various materials) and then patterning the material (or various materials) by lithography and an etch. In one embodiment, the at least one sacrificial material portion can be formed by first depositing a blanket layer of a sacrificial gate dielectric material. The sacrificial gate dielectric material can be an oxide, nitride, and/or oxynitride. In one example, the sacrificial gate dielectric material can be a high-κ material having a dielectric constant greater than silicon dioxide. In some embodiments, a multilayered dielectric structure comprising different dielectric materials, e.g., silicon dioxide, and a high-κ dielectric can be formed and used as the sacrificial gate portion. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition (ALD).

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After forming the blanket layer of sacrificial gate material, a blanket layer of a sacrificial gate cap material can be formed. The sacrificial gate cap material may include a hardmask material such as, for example, silicon dioxide and/or silicon nitride. The sacrificial gate cap material can be formed by any suitable deposition process such as, for example, chemical vapor deposition (CVD) or plasma enhanced chemical vapor deposition (PECVD).

After providing the above mentioned sacrificial material stack (or any subset of the sacrificial materials), lithography and etching can be used to pattern the sacrificial material stack (or any subset of the sacrificial materials) and to provide the at least one sacrificial gate structure. The remaining portions of the sacrificial gate dielectric material constitute a sacrificial gate dielectric portion, the remaining portions of the sacrificial gate material constitute a sacrificial gate portion, and the remaining portions of the sacrificial dielectric cap material constitute a sacrificial dielectric cap portion.

After providing the sacrificial gate structure 150, the dielectric spacer material layer can be formed on exposed surfaces of each sacrificial gate structure 150. The dielectric spacer material layer can be formed by first providing a dielectric spacer material and then etching the dielectric spacer material. One example of a dielectric spacer material that may be employed in the present application is silicon nitride. In general, the dielectric spacer material layer comprises any dielectric spacer material, including, for example, a dielectric nitride, dielectric oxide, and/or dielectric oxynitride. More specifically, the dielectric spacer material layer may be, for example, SiBCN, SiBN, SiOCN, SiON, SiCO, or SiC. In one example, the dielectric spacer material is composed of a dielectric material such as $SiO_2$.

The dielectric spacer material that provides the dielectric spacer material layer may be provided by a deposition process including, for example, ALD, chemical vapor deposition (CVD), plasma enhanced chemical vapor deposition (PECVD), or physical vapor deposition (PVD). The etch used to provide the dielectric spacer material layer may comprise a dry etching process such as, for example, reactive ion etching.

Recesses may be formed within the semiconductor material stack, creating the formation of nanosheet stacks of alternating nanosheets of sacrificial semiconductor material layers 130 and semiconductor channel material layers 140 that are under at least one sacrificial gate structure and dielectric spacer material layer.

The nanosheet stack is formed by removing physically exposed portions of the semiconductor material stack (130, 140) that are not protected by the least one sacrificial gate structure and the dielectric spacer material layer. In general, each recess may include the eventual location of source/drain region 160, for the semiconductor device.

The removing of the portions of the semiconductor material stack (130, 140) not covered by the least one sacrificial gate structure and the dielectric spacer material layer can be performed utilizing an anisotropic etching process such as, for example, reactive ion etching (RIE). Portions of the semiconductor material stack (130, 140) remain beneath at least one sacrificial gate structure and the dielectric spacer material layer. The remaining portion of the semiconductor material stack that is present beneath the at least one sacrificial gate structure and the dielectric spacer material layer is referred to as a nanosheet stack.

Each nanosheet stack includes alternating nanosheets of remaining portions of each sacrificial semiconductor material layer 130 and remaining portions of each semiconductor channel material layer 140. The nanosheet stack includes alternating nanosheets of remaining portions of each of sacrificial semiconductor material layer 130 and semiconductor channel material layer 140. Each nanosheet (i.e., sacrificial semiconductor material layer 130 or semiconductor channel material layer 140) that constitutes the nanosheet stack has a thickness as mentioned above for the individual sacrificial semiconductor material layers 130 and semiconductor channel material layers 140, and a width from 30 nm to 200 nm. In some embodiments, the sidewalls of each sacrificial semiconductor material layer 130 are vertically aligned to sidewalls of each semiconductor channel material layer 140, and the vertically aligned sidewalls of the nanosheet stack are vertically aligned to an outmost sidewall of dielectric spacer material layer.

Sacrificial semiconductor material layer 130 is recessed and inner spacer 196 is formed. Each recessed sacrificial semiconductor material layer 130 has a width that is less than the original width of each sacrificial semiconductor material layer 130. The recessing of each sacrificial semiconductor material layer 130 provides a gap (not specifically shown) between each neighboring pair of semiconductor channel material layer 140 within a given nanosheet stack. The recessing of each sacrificial semiconductor material layer 130 may be performed utilizing a lateral etching process that is selective in removing physically exposed end portions of each sacrificial semiconductor material layer 130 relative to each semiconductor channel material layer 140.

The additional dielectric spacer material that is added can be compositionally the same as the dielectric spacer material layer mentioned above. In one example, the additional dielectric spacer material and the dielectric spacer material layer are both composed of silicon nitride. For clarity, the additional dielectric spacer material and the dielectric spacer material layer can now be referred to as inner spacer 196. The inner spacer 196 is formed by a conformal dielectric liner deposition followed by isotropic etching back the deposited liner.

Gate sidewall spacer 195 may be formed on a topmost surface of semiconductor channel material layer 140 and on the sidewalls of sacrificial gate structure 150. Gate sidewall spacer 195 may be of a dielectric material that is compositionally the same as the dielectric spacer material layer mentioned above, or of a different type of material. For example, the gate sidewall spacer 195 material can be an oxide, nitride, and/or oxynitride. In one example, the gate sidewall spacer 195 material can be a high-κ material having a dielectric constant greater than silicon dioxide. In some embodiments, a multilayered dielectric structure comprising different dielectric materials, e.g., silicon dioxide, and a high-κ dielectric can be formed and used as the gate sidewall spacer 195. The gate sidewall spacer 195 material can be formed by any deposition technique including, for example, chemical vapor deposition (CVD), plasma enhanced chemical vapor deposition (PECVD), physical vapor deposition (PVD), sputtering, or atomic layer deposition (ALD).

Source/drain region 160 is formed by epitaxial growth of a semiconductor material on physically exposed sidewalls of each semiconductor channel material layer 140. In the depicted embodiment, the semiconductor material that provides the source/drain region 160 grows laterally out from the sidewalls of each semiconductor channel material layer 140. The source/drain region 160 has a bottommost surface that directly contacts a topmost surface of semiconductor substrate 110.

Each source/drain region 160 includes a semiconductor material and a dopant. The semiconductor material that provides each source/drain region 160 can be selected from one of the semiconductor materials mentioned above for the semiconductor substrate 110. In some embodiments, the semiconductor material that provides each source/drain region 160 may comprise a same semiconductor material as that which provides semiconductor channel material layer 140. In other embodiments, the semiconductor material that provides each source/drain region 160 may comprise a different semiconductor material than that which provides semiconductor channel material layer 140. For example, the semiconductor material that provides each source/drain region 160 may comprise a silicon germanium alloy, while semiconductor channel material layer 140 may comprise silicon.

The dopant that is present in each source/drain region 160 can be either a p-type dopant or an n-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. "N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. In one embodiment, the dopant that can be present in the each source/drain region 160 can be introduced into the precursor gas that provides each source/drain region 160. In another embodiment, the dopant can be introduced into an intrinsic semiconductor layer by utilizing one of ion implantation or gas phase doping. In one example, each source/drain region 160 comprises a silicon germanium alloy that is doped with a p-type dopant such as, for example, boron. As mentioned above, each source/drain region 160 is formed by an epitaxial growth (or deposition) process, as is defined above.

ILD material 170 is formed above each source/drain region 160 and above STI material 120 (at the adjacent region, not depicted).

ILD material 170 may be composed of silicon dioxide, undoped silicate glass (USG), fluorosilicate glass (FSG), borophosphosilicate glass (BPSG), a spin-on low-κ dielectric layer, a chemical vapor deposition (CVD) low-κ dielectric layer or any combination thereof. The term "low-κ" as used throughout the present application denotes a dielectric material that has a dielectric constant of less than silicon dioxide. In another embodiment, a self-planarizing material such as a spin-on glass (SOG) or a spin-on low-κ dielectric material such as SiLK™ can be used as ILD material 170. The use of a self-planarizing dielectric material as ILD material 170 may avoid the need to perform a subsequent planarizing step.

In one embodiment, ILD material 170 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as ILD material 170, a planarization process or an etch back process follows the deposition of the dielectric material that provides ILD material 170. As is shown in FIGS. 1B-1C, ILD material 170 that is present atop each source/drain region 160 has a topmost surface that is coplanar with a topmost surface of the sacrificial gate structure 150.

Gate cut 180 is a dielectric plug formed in sacrificial gate structure 150.

Gate cut 180 may be formed in a trench created by an etching process, such as reactive-ion etching (RIE), laser ablation, or any etch process which can be used to selectively remove a portion of material such as sacrificial gate structure 150. A hardmask (not shown) may be patterned using photoresist to expose areas of sacrificial gate structure 150 where trenches are desired and the hardmask may be utilized during the etching process in the creation of the trenches. The etching process only removes portions of sacrificial gate structure 150 not protected by the hardmask and the etching process stops on the STI material 120.

In some embodiments, subsequent to the formation of the trenches, the hardmask is removed. In general, the process of removing the hardmask involves the use of an etching process such as RIE, laser ablation, or any etch process which can be used to selectively remove a portion of material, such as the hardmask. In some embodiments, prior to the removal of the hardmask, the photoresist (not shown) is removed. The process of removing the photoresist is similar to that of the process of removing the hardmask.

Gate cut 180 is formed by conformally depositing a dielectric material in the trench. It is specifically contemplated that a nitride such as silicon nitride may be used, but any appropriate dielectric material may be used instead. In the embodiment shown in FIG. 1C, gate cut 180 completely fills the spaces between sacrificial gate structure 150, followed by planarization with a top surface coplanar with a top surface of sacrificial gate structure 150.

Figure 2C:
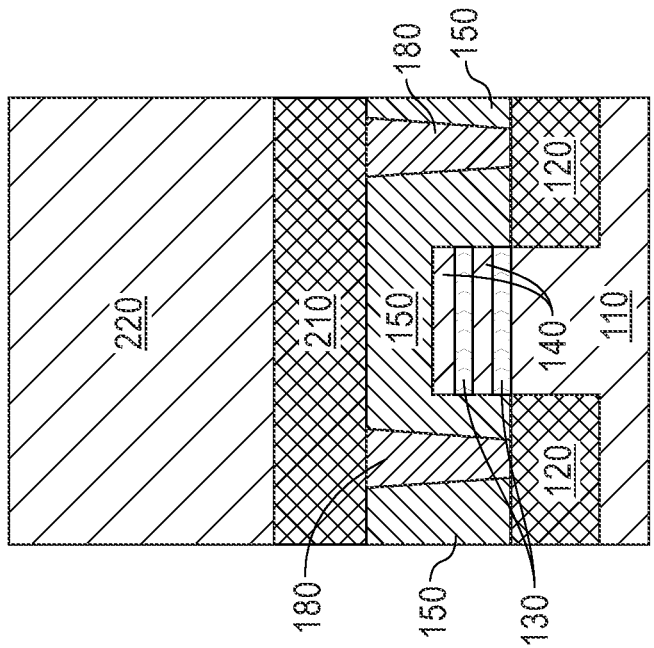
FIG. 2C depicts a cross-sectional view, along section line C of FIG. 2A, of a process of wafer bonding of a top channel via the formation of a bonding oxide and semiconductor layer, in accordance with an embodiment of the invention.
Figure 2B:
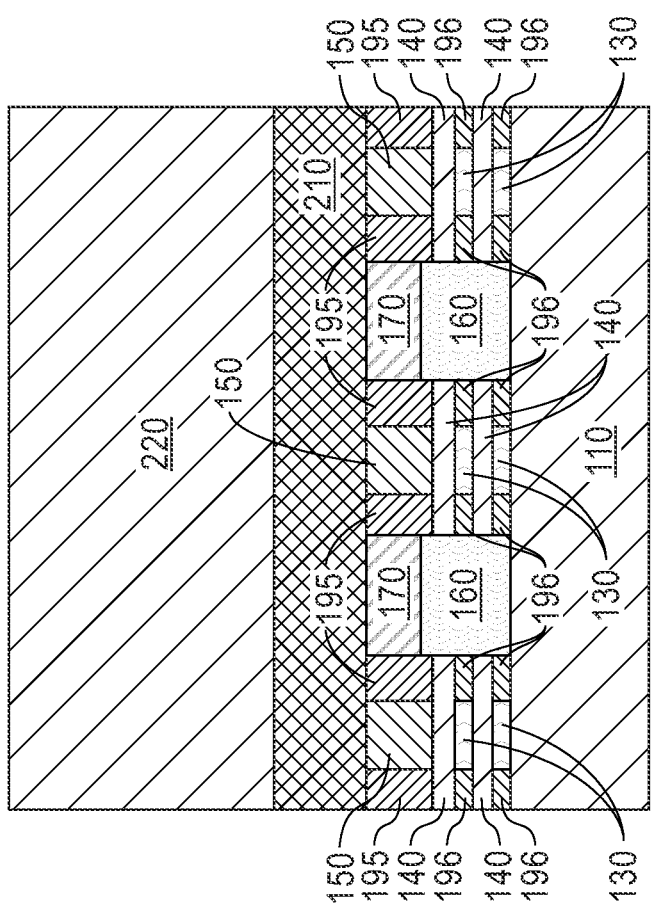
FIG. 2B depicts a cross-sectional view, along section line B of FIG. 2A.

FIG. 2A depicts a top-down view of fabrication steps, in accordance with an embodiment of the present invention. FIG. 2B depicts a cross-sectional view along section line B of FIG. 2A and FIG. 2C depicts a cross-sectional view along section line C of FIG. 7A, in accordance with an embodiment of the present invention. FIGS. 2A-2C depict the wafer bonding of a top channel via the formation of bonding oxide 210 and semiconductor layer 220. Any wafer bonding process known in the art may be used such as, for example, direct bonding, surface activated bonding, plasma activated bonding, anodic bonding, eutectic bonding, glass frit bonding, adhesive bonding, thermocompression bonding, reactive bonding, or transient liquid phase diffusion bonding.

In one example, bonding oxide 210 is formed on the exposed surfaces of the device by depositing an oxide film and then annealing. Suitable deposition processes include, for example, chemical vapor deposition (CVD), low pressure CVD, plasma-enhanced CDV, and other similar low temperature deposition processes. Bonding oxide 210 may have any thickness.

An annealing step is then performed on the device containing bonding oxide 210. After the bonding oxide 210 has been pre-annealed, i.e., outgassed, a top surface of bonding oxide 210 is bonded to a bottom surface of semiconductor layer 220.

Semiconductor layer 220 may be composed of a silicon containing material. Silicon containing materials include, but are not limited to, silicon, single crystal silicon, polycrystalline silicon, SiGe, single crystal SiGe, polycrystalline SiGe, or silicon doped with carbon (C), amorphous silicon, and combinations and multi-layers thereof. Semiconductor layer 220 can also be composed of other semiconductor materials, such as germanium (Ge), and compound semiconductor substrates, such as type III/V semiconductor substrates, e.g., gallium arsenide (GaAs). In general, semiconductor layer 220 is a smooth surface substrate.

Figure 3A:
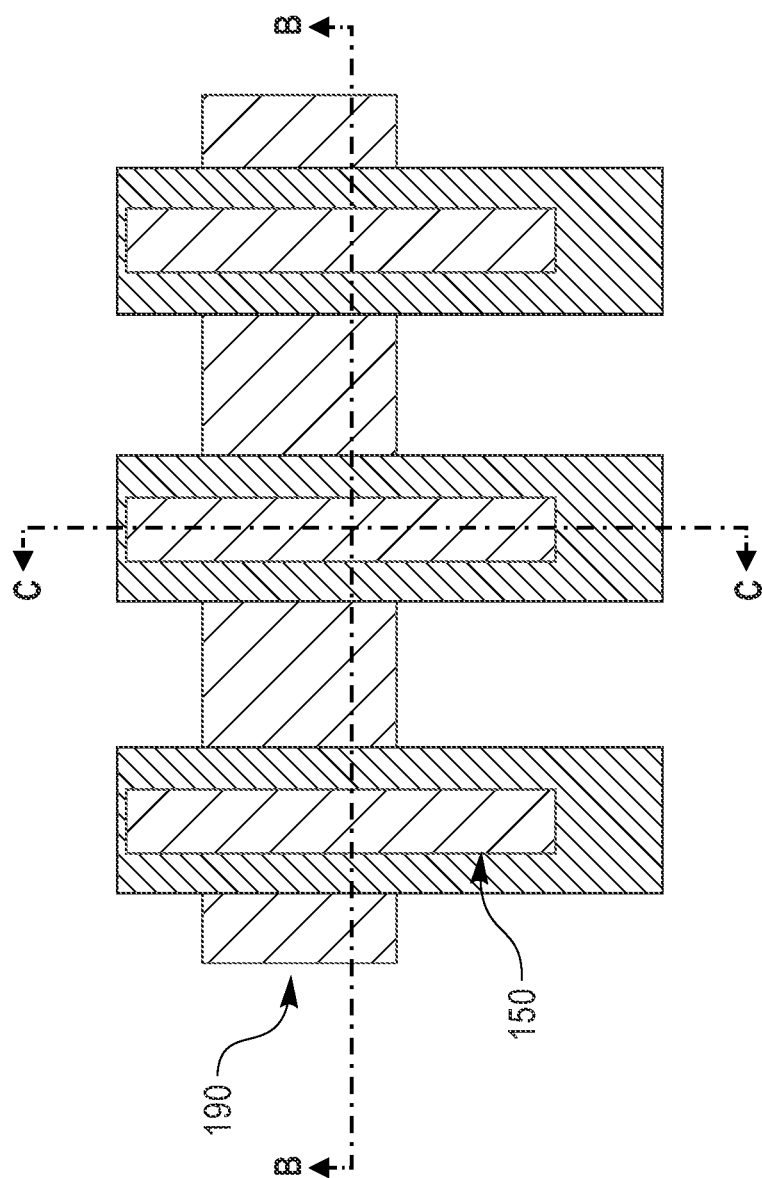
FIG. 3A depicts a top-down view.

FIG. 3A depicts a top-down view of fabrication steps, in accordance with an embodiment of the present invention. FIG. 3B depicts a cross-sectional view along section line B of FIG. 3A and FIG. 3C depicts a cross-sectional view along section line C of FIG. 3A, in accordance with an embodiment of the present invention. FIGS. 3A-3C depict the patterning of hardmask 310 and the formation of fins within semiconductor layer 220.

In the depicted embodiment, hardmask 310 is formed on the top surface of semiconductor layer 220. In various embodiments, hardmask 310 is composed of, for example, a dielectric material such as silicon nitride, silicon oxide, or a combination of silicon nitride and silicon oxide deposited using, for example, a process such as low pressure chemical vapor deposition (LPCVD), rapid thermal chemical vapor deposition (RTCVD), or plasma-enhanced chemical vapor deposition (PECVD). In general, hardmask 310 is a layer of material used to define the shape of fins to be formed in semiconductor layer 220, and in various embodiments any material which is suitable for use as a hard mask layer can be used. In one embodiment, the material of which hardmask 310 is formed has etch selectivity to the material of which semiconductor layer 220 is formed, thus allowing hardmask 310 be removed without removing any portion of semiconductor layer 220, as described in greater detail below.

In various embodiments, standard photolithographic processes are used to define the desired pattern of hardmask 310 in a layer of photoresist (not shown) deposited on the top surface of hardmask 310. The desired hardmask pattern may then be formed in hardmask 310 by removing portions of hardmask 310 from the areas not protected by the pattern in the photoresist layer. Hardmask 310 is removed using, for example, an etch process such as reactive ion etching (RIE). RIE uses chemically reactive plasma, generated by an electromagnetic field, to remove various materials. A person of ordinary skill in the art will recognize that the type of plasma used will depend on the material of which hardmask 310 is composed, or that other etch processes such as wet chemical etching or laser ablation may be used.

Similarly, the portions of semiconductor layer 220 which are exposed, after the patterning of hardmask 310, are removed using a second etch process. In the depicted embodiment, the second etch process utilizes the pattern in hardmask 310 as an etch mask, such that only the portions of semiconductor layer 220 not protected by hardmask 310 are etched. In one embodiment, the etch process used to remove portions of semiconductor layer 220 is an anisotropic etch process, where the etch rate in the downward direction is greater than the etch rate in the lateral direction.

Figure 4A:
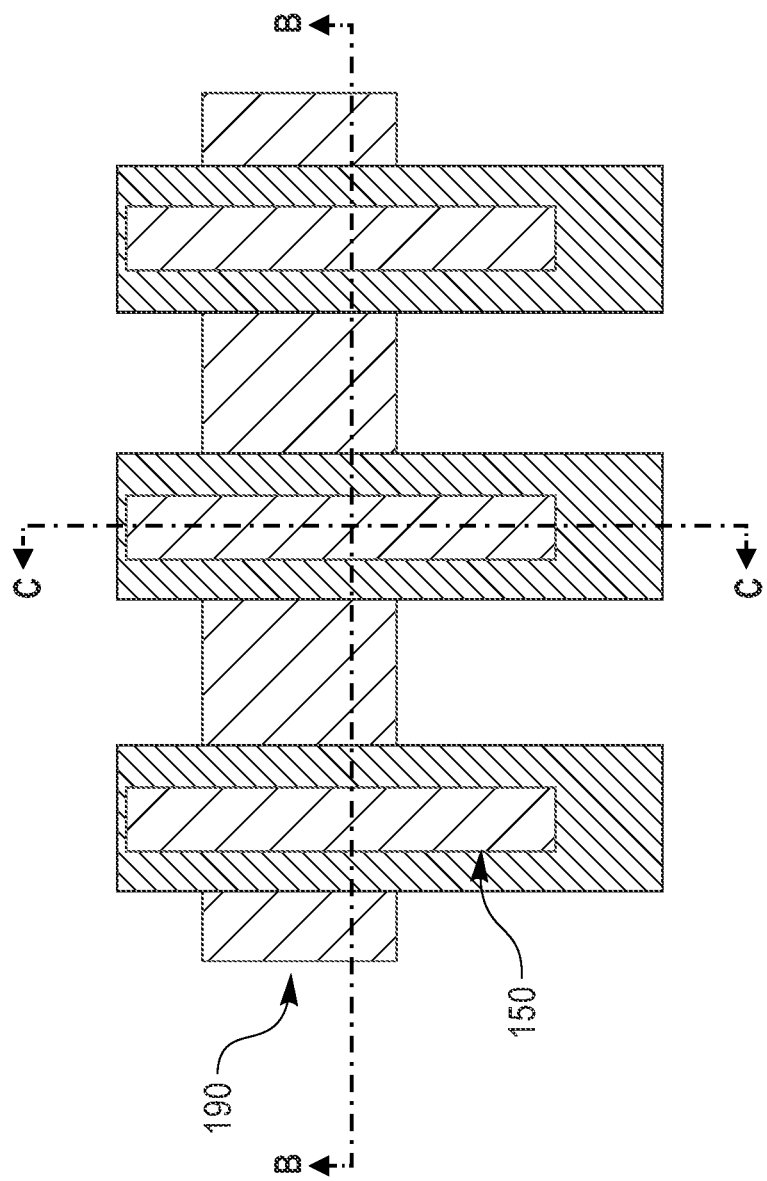
FIG. 4A depicts a top-down view.
Figure 4C:
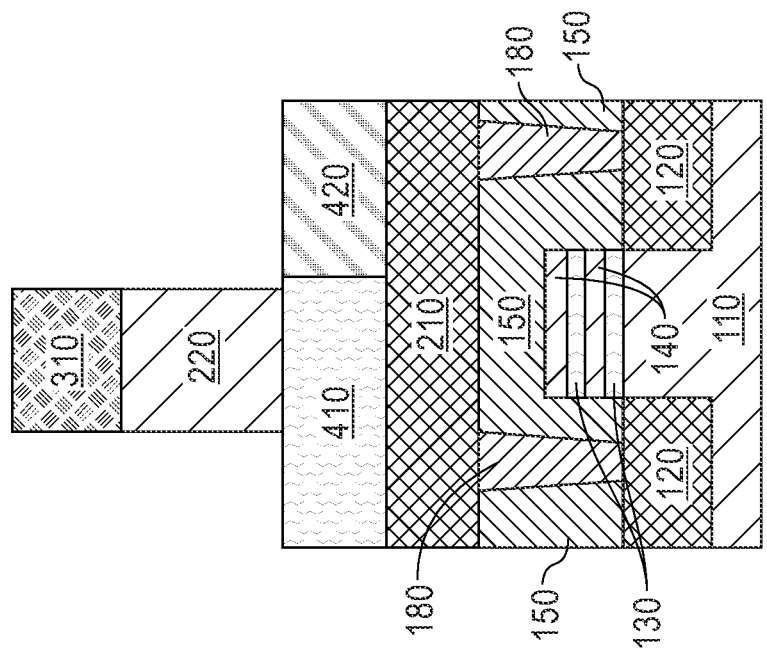
FIG. 4C depicts a cross-sectional view, along section line C of FIG. 4A, of a process of forming a bottom source/drain region and shallow trench isolation (STI) material, in accordance with an embodiment of the present invention.
Figure 4B:
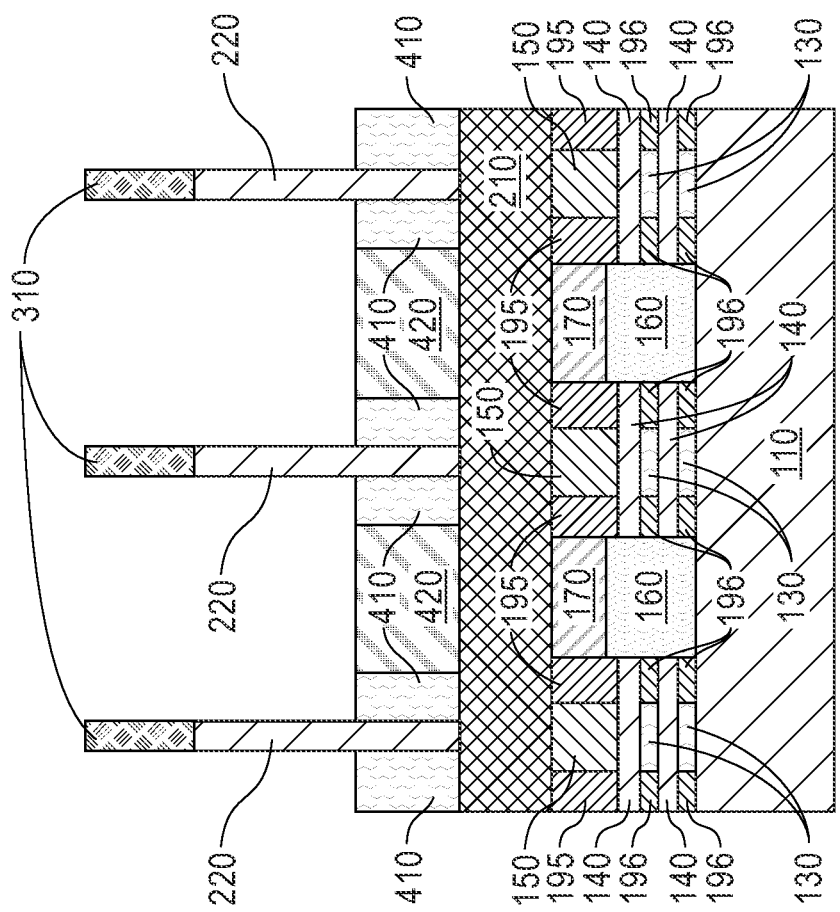
FIG. 4B depicts a cross-sectional view, along section line B of FIG. 4A.

FIG. 4A depicts a top-down view of fabrication steps, in accordance with an embodiment of the present invention. FIG. 4B depicts a cross-sectional view along section line B of FIG. 4A and FIG. 4C depicts a cross-sectional view along section line C of FIG. 4A, in accordance with an embodiment of the present invention. FIGS. 4A-4C depict the formation of bottom source/drain region 410 and STI material 420.

Initially, a protective spacer liner (not shown) is formed to protect the sidewall of the fins, then an etching process may be used, as described previously, to remove portions of semiconductor layer 220 and expose a top surface of bonding oxide 210. Bottom source/drain region 410 is formed by epitaxial growth of a semiconductor material on physically exposed sidewalls of each semiconductor layer 220. In the present application, the semiconductor material that provides the bottom source/drain region 410 grows laterally out from the sidewalls of each semiconductor layer 220. The bottom source/drain region 410 has a bottommost surface that directly contacts a topmost surface of bonding oxide 210.

Each bottom source/drain region 410 includes a semiconductor material and a dopant. The semiconductor material that provides each bottom source/drain region 410 can be selected from one of the semiconductor materials mentioned above for the semiconductor substrate 110. In some embodiments, the semiconductor material that provides each bottom source/drain region 410 may comprise a same semiconductor material as that which provides semiconductor channel material layer 140. In other embodiments, the semiconductor material that provides each bottom source/drain region 410 may comprise a different semiconductor material than that which provides semiconductor channel material layer 140. For example, the semiconductor material that provides each bottom source/drain region 410 may comprise a silicon germanium alloy, while semiconductor channel material layer 140 may comprise silicon.

The dopant that is present in each bottom source/drain region 410 can be either a p-type dopant or an n-type dopant. In one embodiment, the dopant that can be present in each bottom source/drain region 410 can be introduced into the precursor gas that provides each bottom source/drain region 410. In another embodiment, the dopant can be introduced into an intrinsic semiconductor layer by utilizing one of ion implantation or gas phase doping. In one example, each bottom source/drain region 410 comprises a silicon germanium alloy that is doped with a p-type dopant such as, for example, boron. As mentioned above, each bottom source/drain region 410 is formed by an epitaxial growth (or deposition) process, as is defined above.

After that, a patterning process is used to remove the unwanted bottom source/drain regions by conventional lithography and etching process, then STI material 420 is formed in the regions adjacent to source/drain region 410 such as the regions depicted in FIGS. 4B-4C. The STI material 420 can be formed by any suitable process including, if necessary, lithography or etching, to form trenches, and then filling the trenches with an insulating (dielectric) material, such as silicon dioxide. Following the deposition of STI material 420, an additional CMP and etching process can be performed to planarize and recess the STI material 420. After that, the protective spacer liner (not shown) is removed.

Figure 5A:
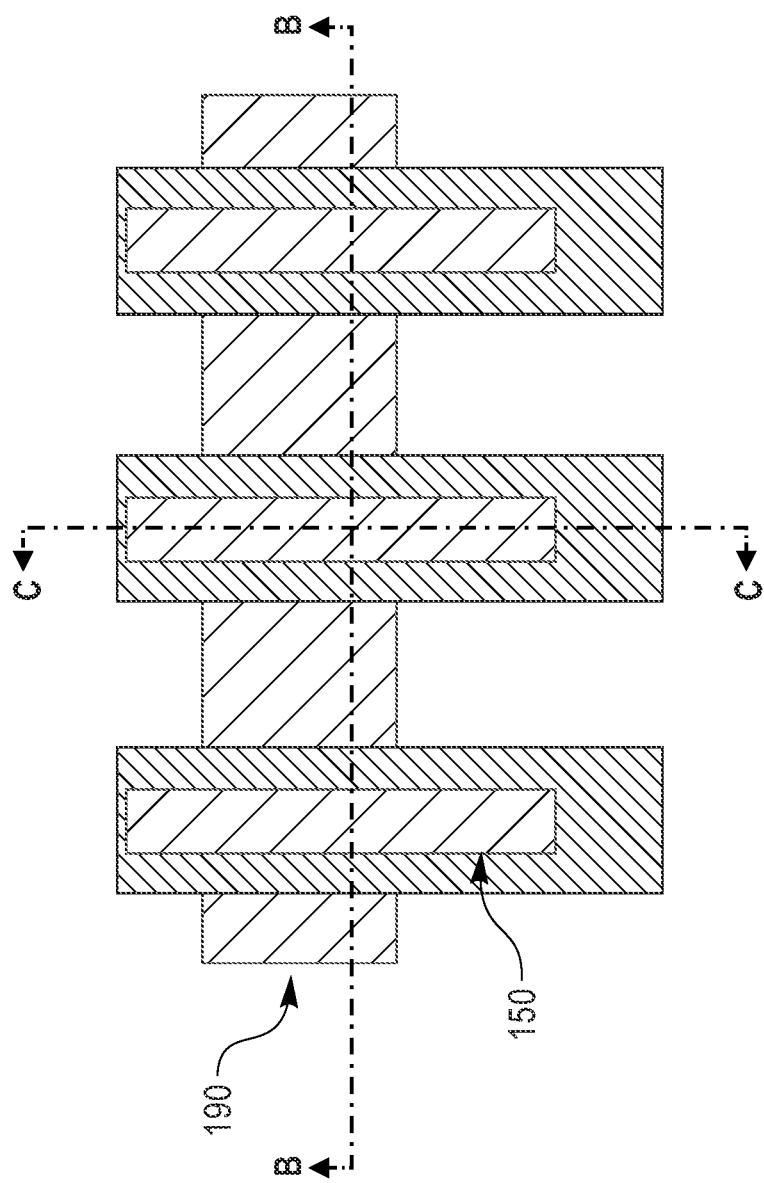
FIG. 5A depicts a top-down view.

FIG. 5A depicts a top-down view of fabrication steps, in accordance with an embodiment of the present invention. FIG. 5B depicts a cross-sectional view along section line B of FIG. 5A and FIG. 5C depicts a cross-sectional view along section line C of FIG. 7A, in accordance with an embodiment of the present invention. FIGS. 5A-5C depict the formation of a Vertical-Transport Field Effect Transistor (VTFET) bottom spacer 510 and the formation and patterning of sacrificial gate structure 520.

bottom spacer 510 may be compositionally the same as gate sidewall spacer 195 or inner spacer 196. Bottom spacer 510 can be formed on exposed surfaces of bottom source/drain region 410 and STI material 420. Bottom spacer 510 can be formed by first depositing a dielectric material and then etching the dielectric material back or performing a directional deposition process, such as gas cluster ion beam (GCIB) or high density plasma (HDP) deposition. One example of a bottom spacer material that may be employed in the present application is silicon nitride. In general, bottom spacer 510 comprises any dielectric spacer material, including, for example, a dielectric nitride, dielectric oxide, and/or dielectric oxynitride. More specifically, the dielectric spacer material layer may be, for example, SiBCN, SiBN, SiOCN, SiON, SiCO, or SiC. In one example, the bottom spacer material is composed of dielectric material with lower-κ value, such as $SiO_2$.

Sacrificial gate structure 520 may be formed. Each sacrificial gate structure 520 is located on a sidewall of semiconductor layer 220 and hardmask 310 and on a topmost surface of a portion of bottom spacer 510.

Each sacrificial gate structure 520 may include a single sacrificial material portion or a stack of two or more sacrificial material portions (i.e., at least one sacrificial material portion). In one embodiment, the at least one sacrificial material portion comprises, from bottom to top, a sacrificial gate dielectric portion, and a sacrificial gate portion. In some embodiments, the sacrificial gate dielectric portion can be omitted and only a sacrificial gate portion is formed. The at least one sacrificial material portion can be formed by forming a blanket layer (or layers) of a material (or various materials) and then patterning the material (or various materials) by lithography and an etch. In one embodiment, the at least one sacrificial material portion can be formed by first depositing a conformal layer of a sacrificial gate dielectric material. The sacrificial gate dielectric material can be an oxide, nitride, and/or oxynitride. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition (ALD).

After forming the conformal layer of sacrificial gate dielectric material, a conformal layer of a sacrificial gate material can be formed on the conformal layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

After providing the above mentioned sacrificial material stack (or any subset of the sacrificial materials), lithography and etching can be used to pattern the sacrificial material stack (or any subset of the sacrificial materials) and to provide the at least one sacrificial gate structure. The remaining portions of the sacrificial gate dielectric material constitute a sacrificial gate dielectric portion, the remaining portions of the sacrificial gate material constitute a sacrificial gate portion.

In general, sacrificial gate structure 520 is patterned such that a portion of sacrificial gate structure 520 extends laterally on a topmost surface of bottom spacer 510 that corresponds to an eventual placement of a contact to both a gate of the bottom horizontal FET of the device and a gate of the top vertical FET of the device (see subsequent Figures).

Figure 6A:
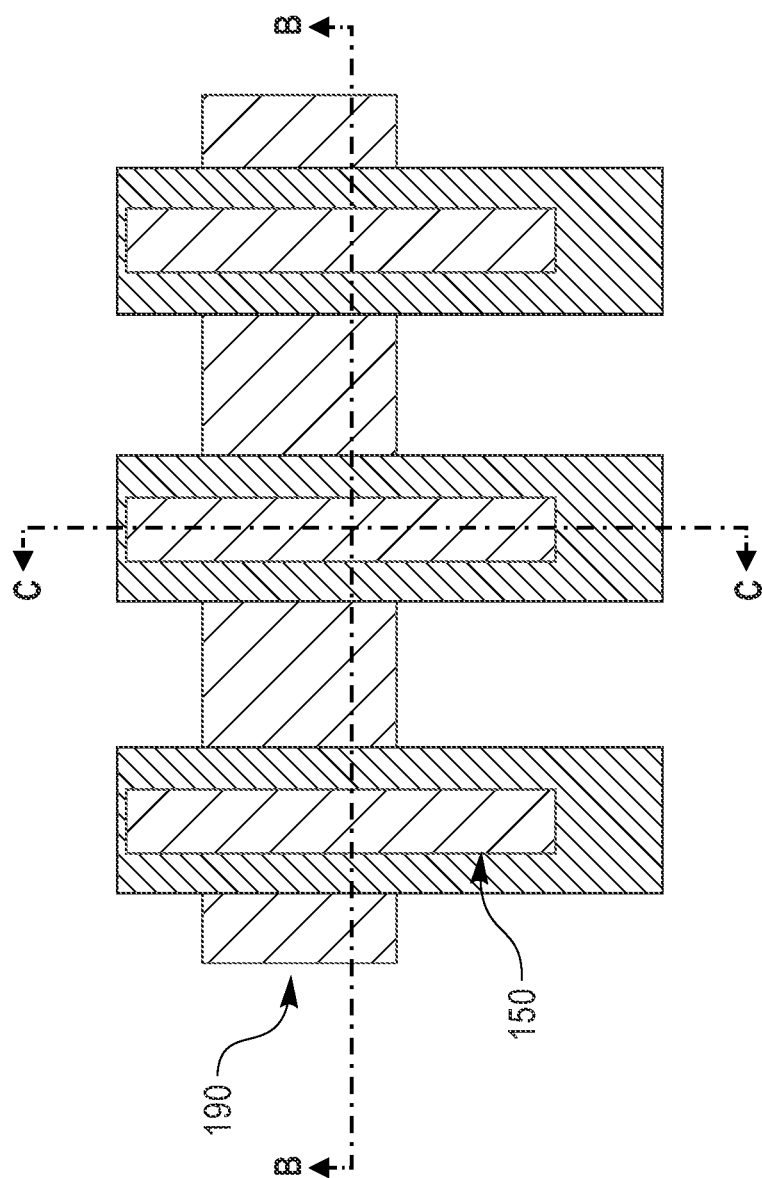
FIG. 6A depicts a top-down view.

FIG. 6A depicts a top-down view of fabrication steps, in accordance with an embodiment of the present invention. FIG. 6B depicts a cross-sectional view along section line B of FIG. 6A and FIG. 6C depicts a cross-sectional view along section line C of FIG. 6A, in accordance with an embodiment of the present invention. FIGS. 6A-6C depict the formation of ILD material 610.

ILD material 610 is formed above exposed portions of bottom spacer 510 and sacrificial gate structure 520.

ILD material 610 may be composed of silicon dioxide, undoped silicate glass (USG), fluorosilicate glass (FSG), borophosphosilicate glass (BPSG), a spin-on low-κ dielectric layer, a chemical vapor deposition (CVD) low-κ dielectric layer or any combination thereof. The term "low-κ" as used throughout the present application denotes a dielectric material that has a dielectric constant of less than silicon dioxide. In another embodiment, a self-planarizing material such as a spin-on glass (SOG) or a spin-on low-κ dielectric material such as SiLK™ can be used as ILD material 610. The use of a self-planarizing dielectric material as ILD material 610 may avoid the need to perform a subsequent planarizing step.

In one embodiment, ILD material 610 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as ILD material 610, a planarization process or an etch back process follows the deposition of the dielectric material that provides ILD material 610 in order to expose the topmost surfaces of hardmask 310 and sacrificial gate structure 520. As is shown in FIGS. 6B-6C, ILD material 610 has a topmost surface that is coplanar with a topmost surface of hardmask 310 and sacrificial gate structure 520.

Figure 7A:
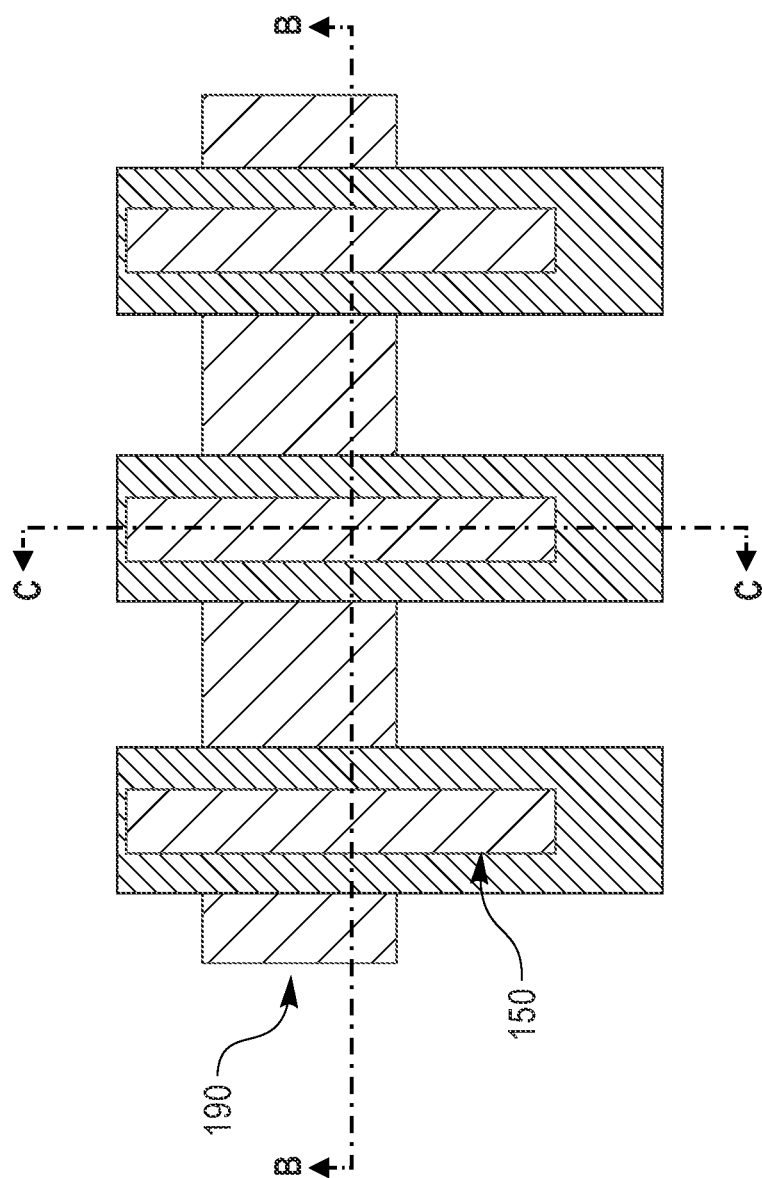
FIG. 7A depicts a top-down view.
Figure 7C:
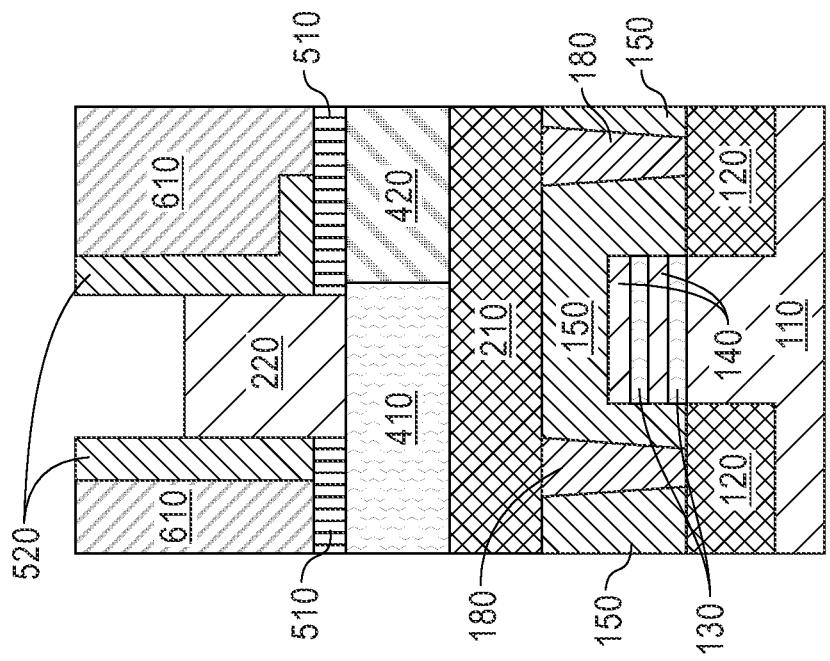
FIG. 7C depicts a cross-sectional view, along section line C of FIG. 7A, of a process of removing a hardmask, in accordance with an embodiment of the present invention.
Figure 7B:
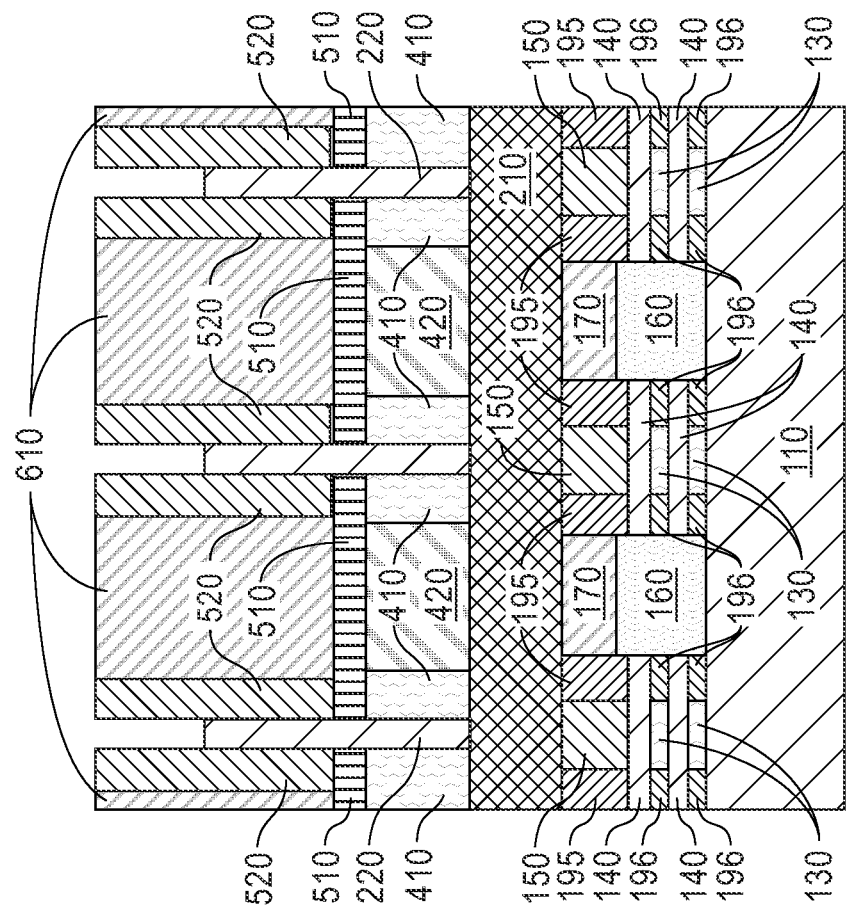
FIG. 7B depicts a cross-sectional view, along section line B of FIG. 7A.

FIG. 7A depicts a top-down view of fabrication steps, in accordance with an embodiment of the present invention. FIG. 7B depicts a cross-sectional view along section line B of FIG. 7A and FIG. 7C depicts a cross-sectional view along section line C of FIG. 7A, in accordance with an embodiment of the present invention. FIGS. 7A-7C depict the removal of hardmask 310.

In general, the process of removing hardmask 310 involves the use of an etching process such as RIE, laser ablation, or any etch process which can be used to selectively remove a portion of material, such as hardmask 310.

Figure 8A:
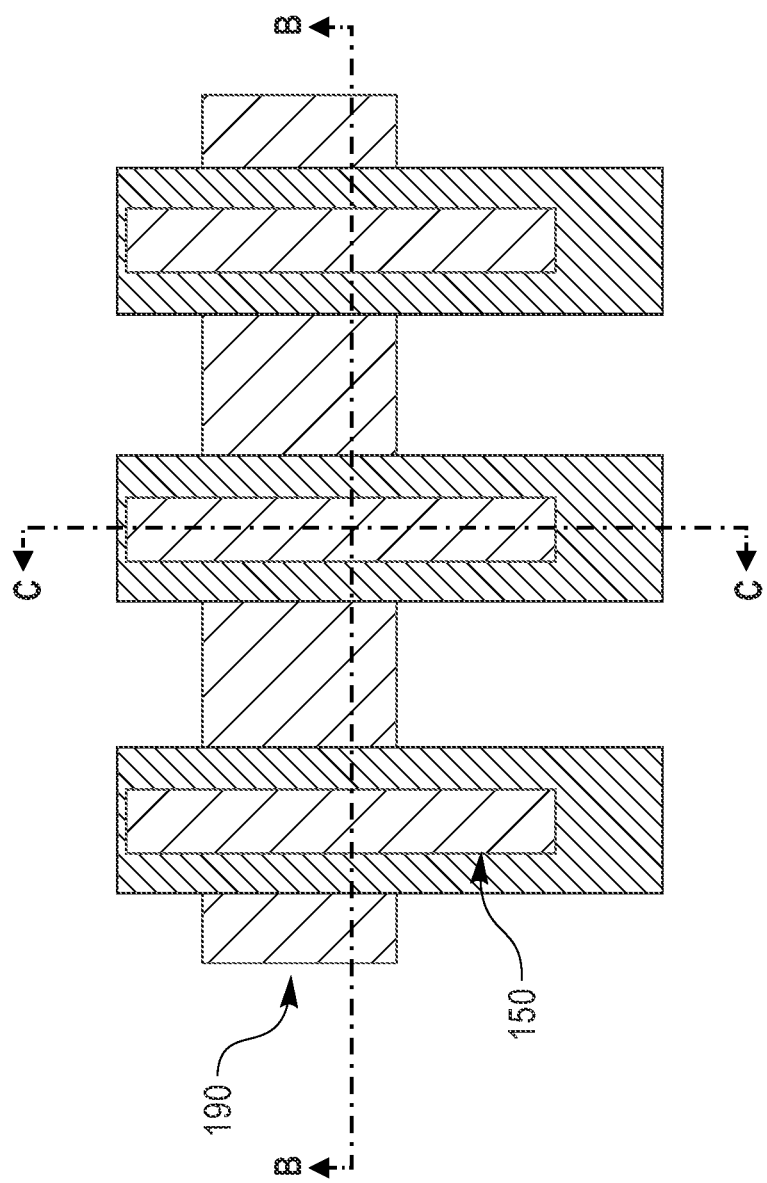
FIG. 8A depicts a top-down view.
Figure 8C:
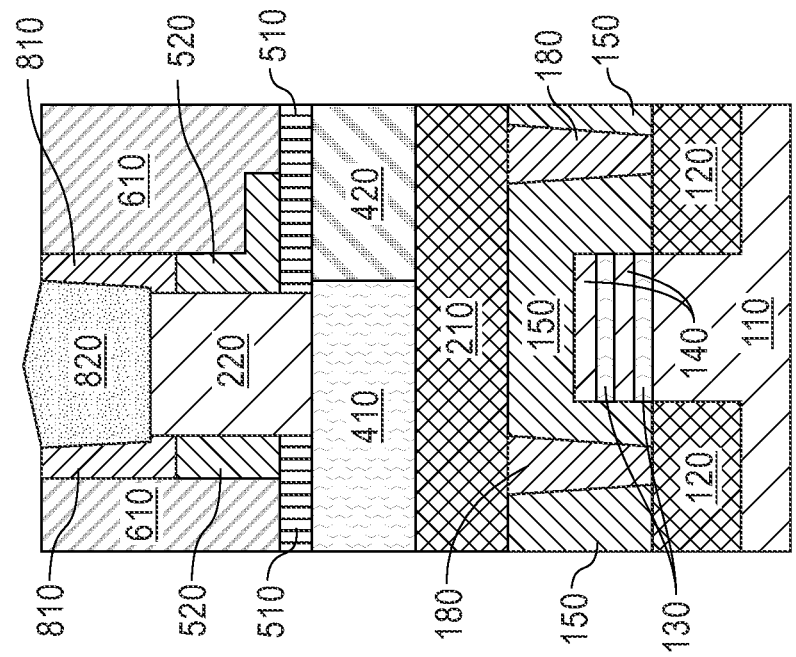
FIG. 8C depicts a cross-sectional view, along section line C of FIG. 8A, of a process of receding a sacrificial gate structure and forming a top spacer and top source/drain region, in accordance with an embodiment of the present invention.
Figure 8B:
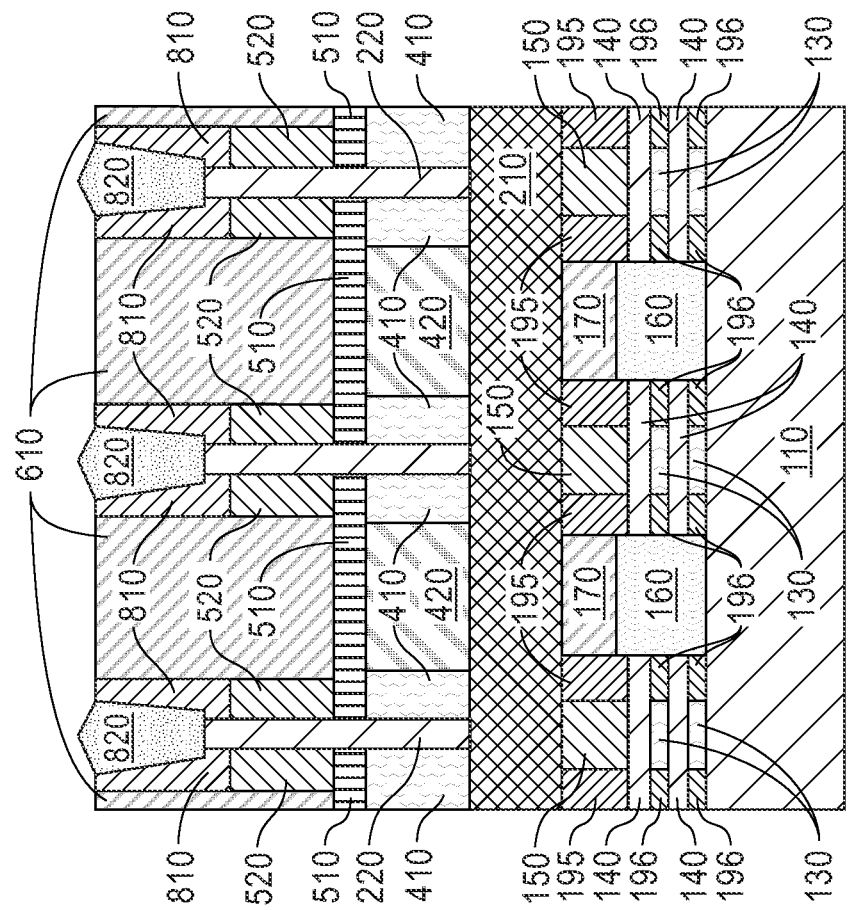
FIG. 8B depicts a cross-sectional view, along section line B of FIG. 8A.

FIG. 8A depicts a top-down view of fabrication steps, in accordance with an embodiment of the present invention. FIG. 8B depicts a cross-sectional view along section line B of FIG. 8A and FIG. 8C depicts a cross-sectional view along section line C of FIG. 8A, in accordance with an embodiment of the present invention. FIGS. 8A-8C depict the recession of sacrificial gate structure 520 and the formation of top spacer 810 and top source/drain region 820.

Sacrificial gate structure 520 may be recessed by an etching process, such as reactive-ion etching (RIE), laser ablation, or any etch process which can be used to selectively remove a portion of material such as sacrificial gate structure 520.

Top spacer 810 is then formed. Top spacer 810 may be compositionally the same as gate sidewall spacer 195, and/or inner spacer 196 and/or bottom spacer 510. Top spacer 810 can be formed on exposed surfaces. Top spacer 810 can be formed by first conformally depositing a top spacer liner material and then followed by an anisotropic etching process. One example of a top spacer material that may be employed in the present application is silicon nitride. In general, top spacer 810 comprises any dielectric spacer material, including, for example, a dielectric nitride, dielectric oxide, and/or dielectric oxynitride. More specifically, the dielectric spacer material layer may be, for example, SiBCN, SiBN, SiOCN, SiON, SiCO, or SiC. In one example, the top spacer material is composed of a dielectric material with lower-κ value, such as $SiO_2$.

Top source/drain region 820 may be formed within gaps of top spacers 810 and on semiconductor layer 220. Top source/drain region 820 is formed by epitaxial growth of a semiconductor material on physically exposed surfaces of semiconductor layer 220. In the depicted embodiment, the semiconductor material that provides the top source/drain region 820 grows up from the top surface of each semiconductor layer 220. Top source/drain region 820 has a bottommost surface that directly contacts a topmost surface of semiconductor layer 220.

Each top source/drain region 820 includes a semiconductor material and a dopant. The semiconductor material that provides each top source/drain region 820 can be selected from one of the semiconductor materials mentioned above for the semiconductor substrate 110 and/or the semiconductor layer 220. In some embodiments, the semiconductor material that provides each top source/drain region 820 may comprise a same semiconductor material as that which provides semiconductor channel material layer 140. In other embodiments, the semiconductor material that provides each top source/drain region 820 may comprise a different semiconductor material than that which provides semiconductor channel material layer 140. For example, the semiconductor material that provides each top source/drain region 820 may comprise a silicon germanium alloy, while semiconductor channel material layer 140 may comprise silicon.

The dopant that is present in each top source/drain region 820 can be either a p-type dopant or an n-type dopant. In one embodiment, the dopant that can be present in the each top source/drain region 820 can be introduced into the precursor gas that provides each top source/drain region 820. In another embodiment, the dopant can be introduced into an intrinsic semiconductor layer by utilizing one of ion implantation or gas phase doping. In one example, each top source/drain region 820 comprises a silicon germanium alloy that is doped with a p-type dopant such as, for example, boron. As mentioned above, each top source/drain region 820 is formed by an epitaxial growth (or deposition) process, as is defined above. In some embodiments, each top source/drain region 820 has a faceted upper surface.

Figure 9A:
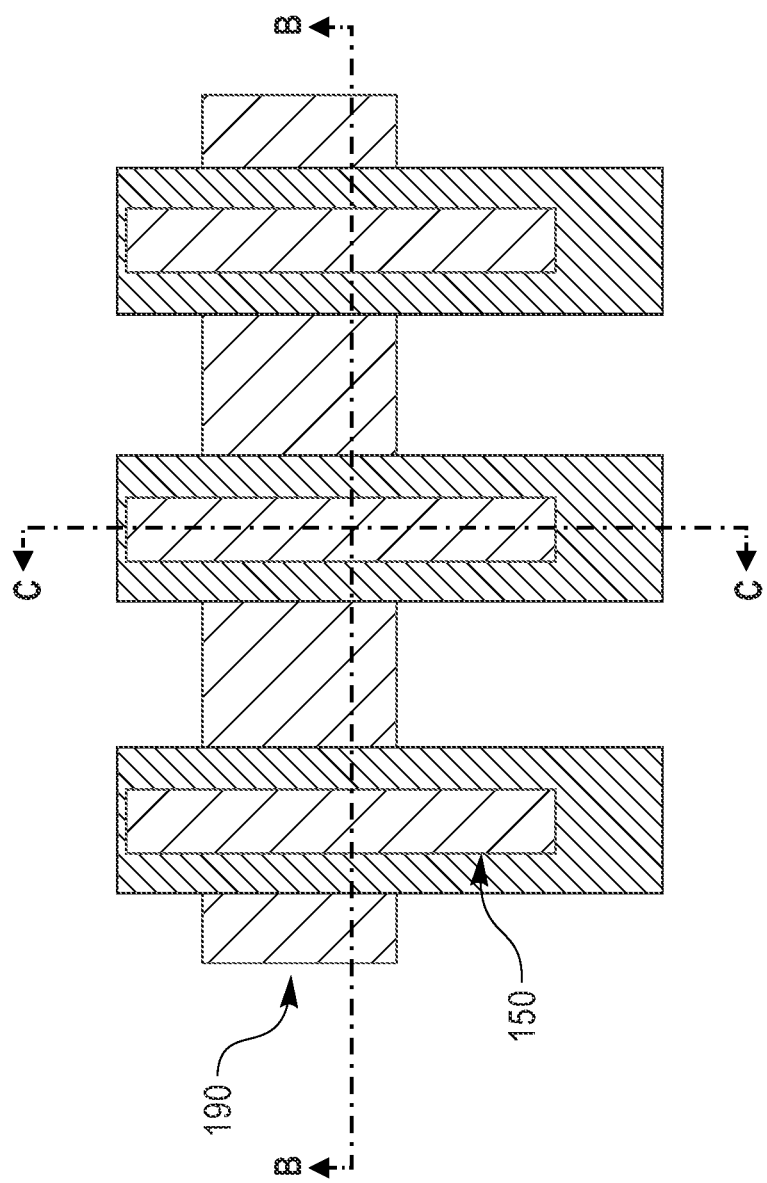
FIG. 9A depicts a top-down view.
Figure 9C:
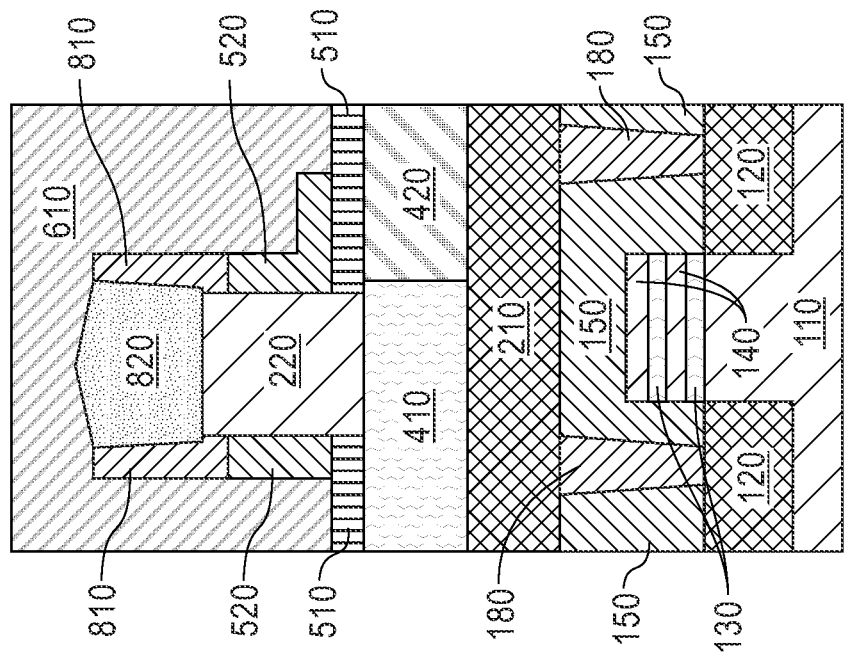
FIG. 9C depicts a cross-sectional view, along section line C of FIG. 9A, of a process of forming additional ILD material, in accordance with an embodiment of the present invention.
Figure 9B:
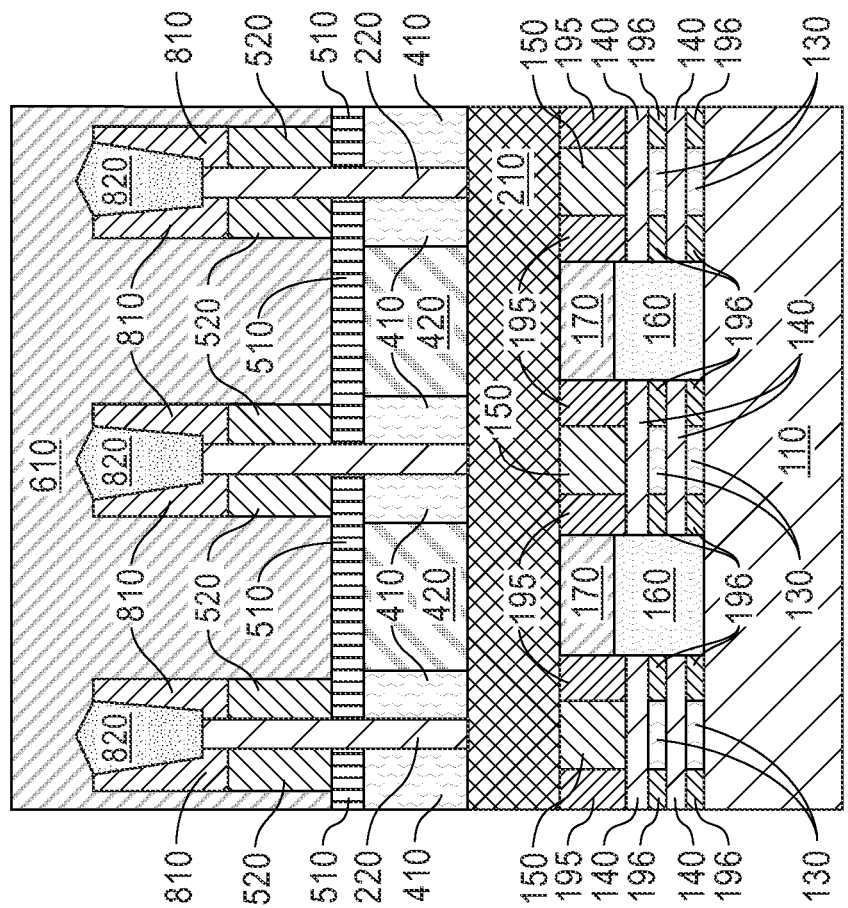
FIG. 9B depicts a cross-sectional view, along section line B of FIG. 9A.

FIG. 9A depicts a top-down view of fabrication steps, in accordance with an embodiment of the present invention. FIG. 9B depicts a cross-sectional view along section line B of FIG. 9A and FIG. 9C depicts a cross-sectional view along section line C of FIG. 9A, in accordance with an embodiment of the present invention. FIGS. 9A-9C depicts the formation of additional ILD material.

Additional ILD material is formed above each top source/drain region 820, top spacer 810, and already present ILD material 610. For sake of simplicity, the additional ILD material and the already present ILD material 610 are hereinafter referred to as ILD material 610.

ILD material 610 may be composed of silicon dioxide, undoped silicate glass (USG), fluorosilicate glass (FSG), borophosphosilicate glass (BPSG), a spin-on low-κ dielectric layer, a chemical vapor deposition (CVD) low-κ dielectric layer or any combination thereof. The term "low-κ" as used throughout the present application denotes a dielectric material that has a dielectric constant of less than silicon dioxide. In another embodiment, a self-planarizing material such as a spin-on glass (SOG) or a spin-on low-κ dielectric material such as SiLK™ can be used as ILD material 610.

The use of a self-planarizing dielectric material as ILD material 610 may avoid the need to perform a subsequent planarizing step.

In one embodiment, ILD material 610 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as ILD material 610, a planarization process or an etch back process follows the deposition of the dielectric material that provides ILD material 610.

Figure 10A:
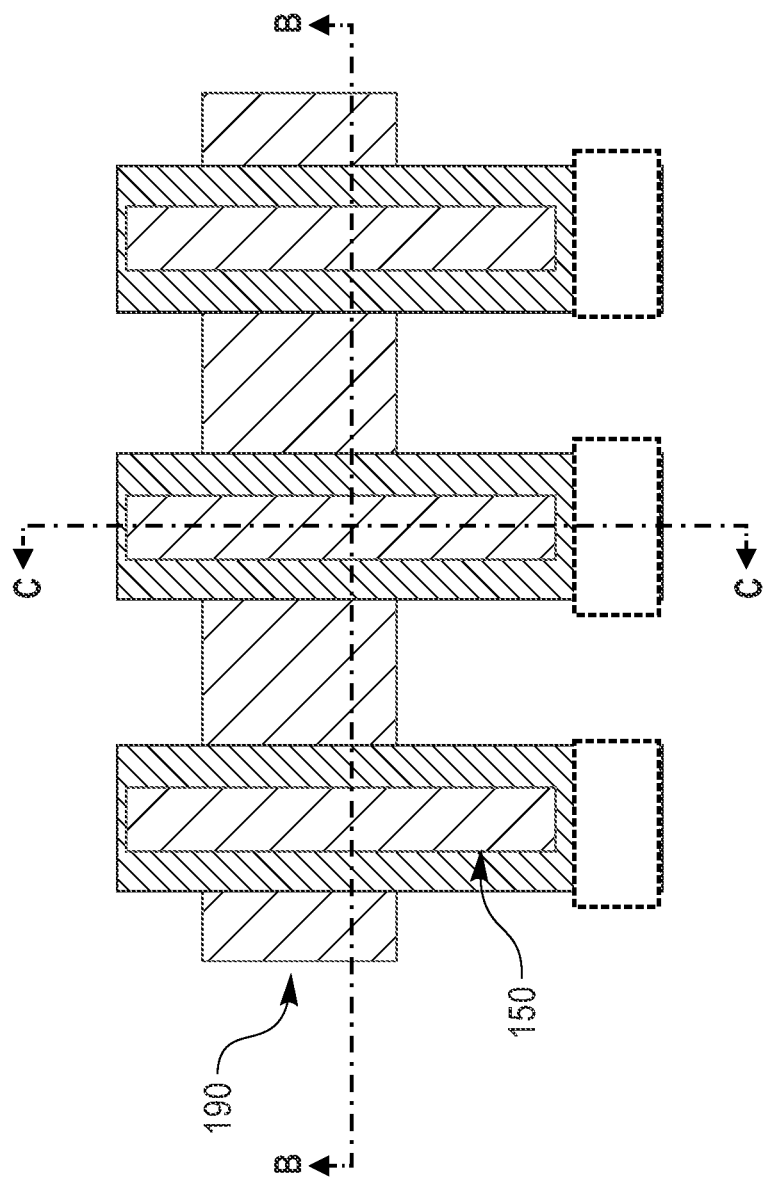
FIG. 10A depicts a top-down view.

FIG. 10A depicts a top-down view of fabrication steps, in accordance with an embodiment of the present invention. FIG. 10B depicts a cross-sectional view along section line B of FIG. 10A and FIG. 10C depicts a cross-sectional view along section line C of FIG. 10A, in accordance with an embodiment of the present invention. FIGS. 10A-10C depict patterning and formation of contact trenches, each trench for both the upper gate of a vertical FET and the lower gate of a horizontal FET of the device.

Trenches may be formed by an etching process, such as reactive-ion etching (RIE), laser ablation, or any etch process which can be used to selectively remove a portion of material such as ILD material 610, sacrificial gate structure 520, bottom spacer 510, STI material 420, and/or bonding oxide 210. A hardmask (not shown) may be patterned using photoresist to expose areas where trenches are desired and the hardmask may be utilized during the etching process in the creation of the trenches. The etching process only removes portions of the device not protected by the hardmask and the etching process stops at sacrificial gate structure 150.

In some embodiments, subsequent to the formation of the trenches, the hardmask is removed. In general, the process of removing the hardmask involves the use of an etching process such as RIE, laser ablation, or any etch process which can be used to selectively remove a portion of material, such as the hardmask. In some embodiments, prior to the removal of the hardmask, the photoresist (not shown) is removed. The process of removing the photoresist is similar to that of the process of removing the hardmask.

Figure 11A:
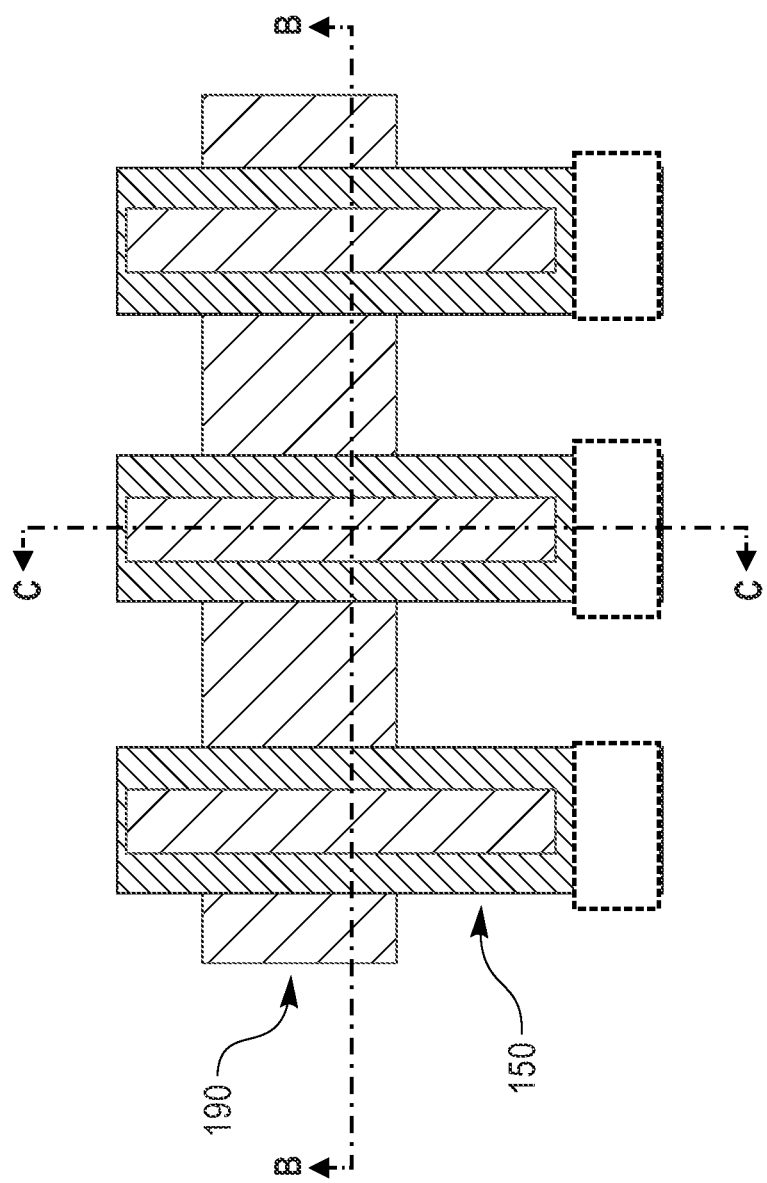
FIG. 11A depicts a top-down view.
Figure 11C:
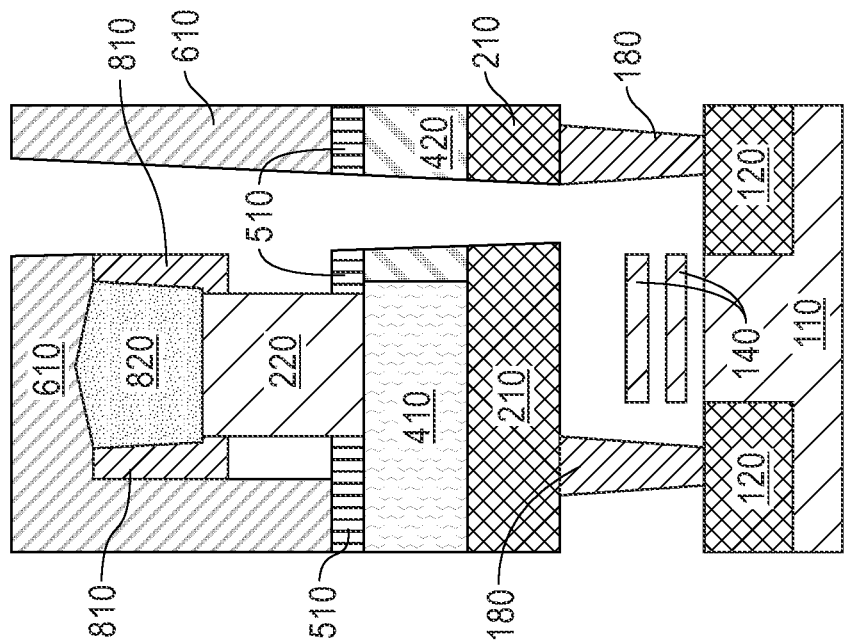
FIG. 11C depicts a cross-sectional view, along section line C of FIG. 11A, of a process of removing each sacrificial gate structure, in accordance with an embodiment of the present invention.
Figure 11B:
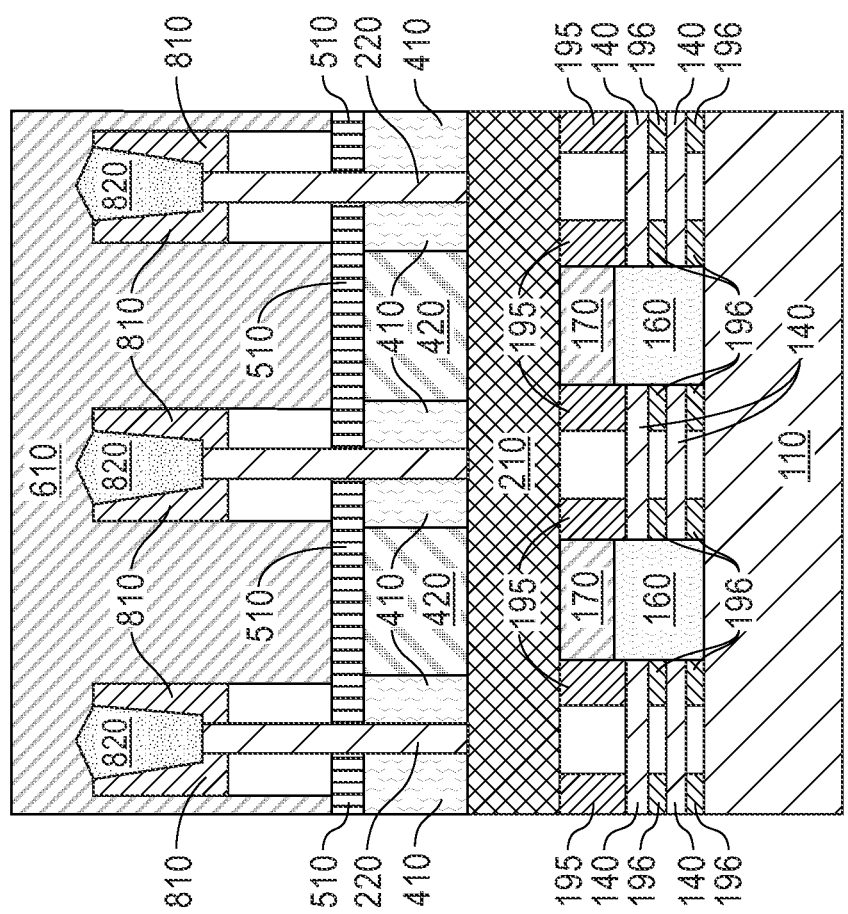
FIG. 11B depicts a cross-sectional view, along section line B of FIG. 11A.

FIG. 11A depicts a top-down view of fabrication steps, in accordance with an embodiment of the present invention. FIG. 11B depicts a cross-sectional view along section line B of FIG. 11A and FIG. 11C depicts a cross-sectional view along section line C of FIG. 11A, in accordance with an embodiment of the present invention. FIGS. 11A-11C depict the removal of each sacrificial gate structure (i.e., sacrificial gate structure 150 and sacrificial gate structure 520) and each sacrificial semiconductor material nanosheet (i.e., sacrificial semiconductor material layer 130).

Each sacrificial gate structure (i.e., sacrificial gate structure 150 and sacrificial gate structure 520) is removed to provide a gate cavity.

Next, each semiconductor channel material nanosheet (i.e., semiconductor channel material layer 140) is suspended by selectively etching each recessed sacrificial semiconductor material nanosheet (i.e., sacrificial semiconductor material layer 130) relative to each semiconductor channel material nanosheet (i.e., semiconductor channel material layer 140).

Figure 12A:
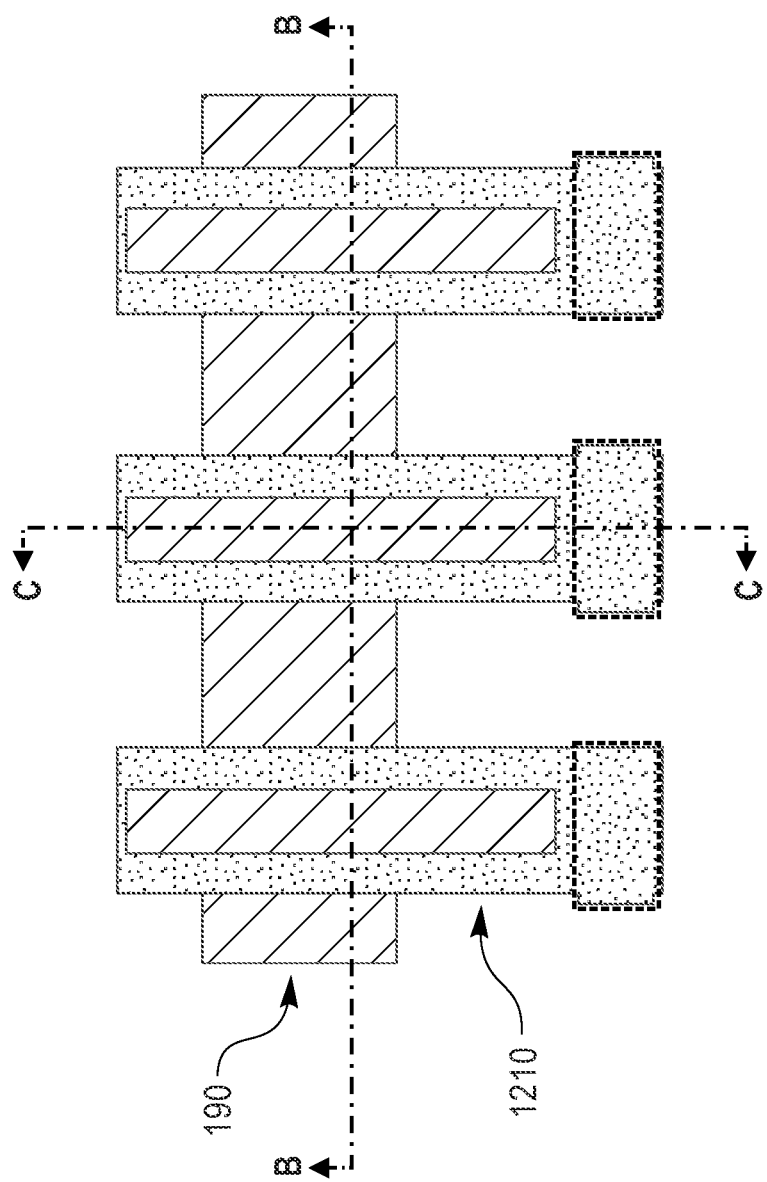
FIG. 12A depicts a top-down view.
Figure 12C:
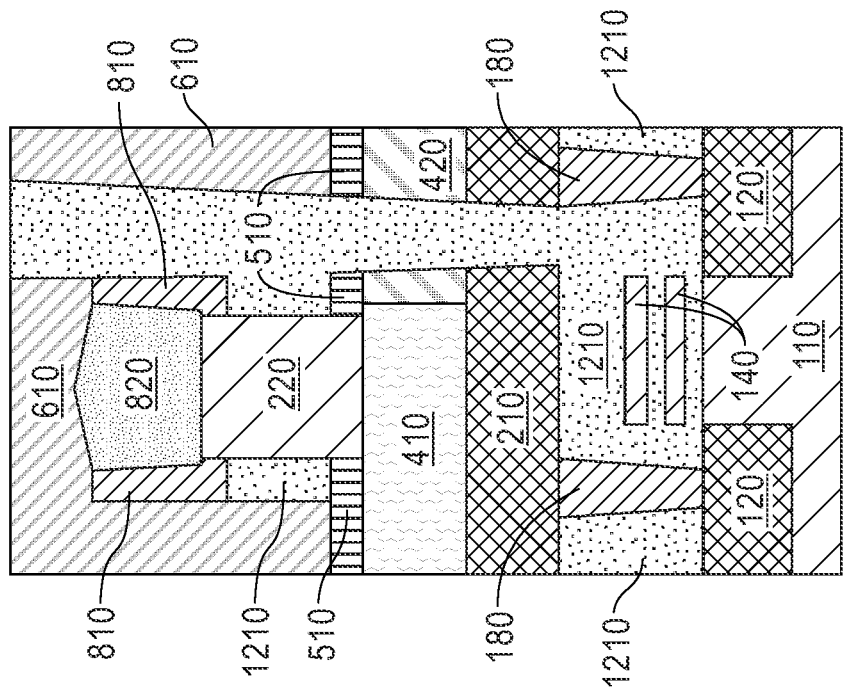
FIG. 12C depicts a cross-sectional view, along section line C of FIG. 12A, of a process of forming a gate structure for both the bottom horizontal FET and the top vertical FET and a corresponding gate contact for both FETs, in accordance with an embodiment of the present invention.
Figure 12B:
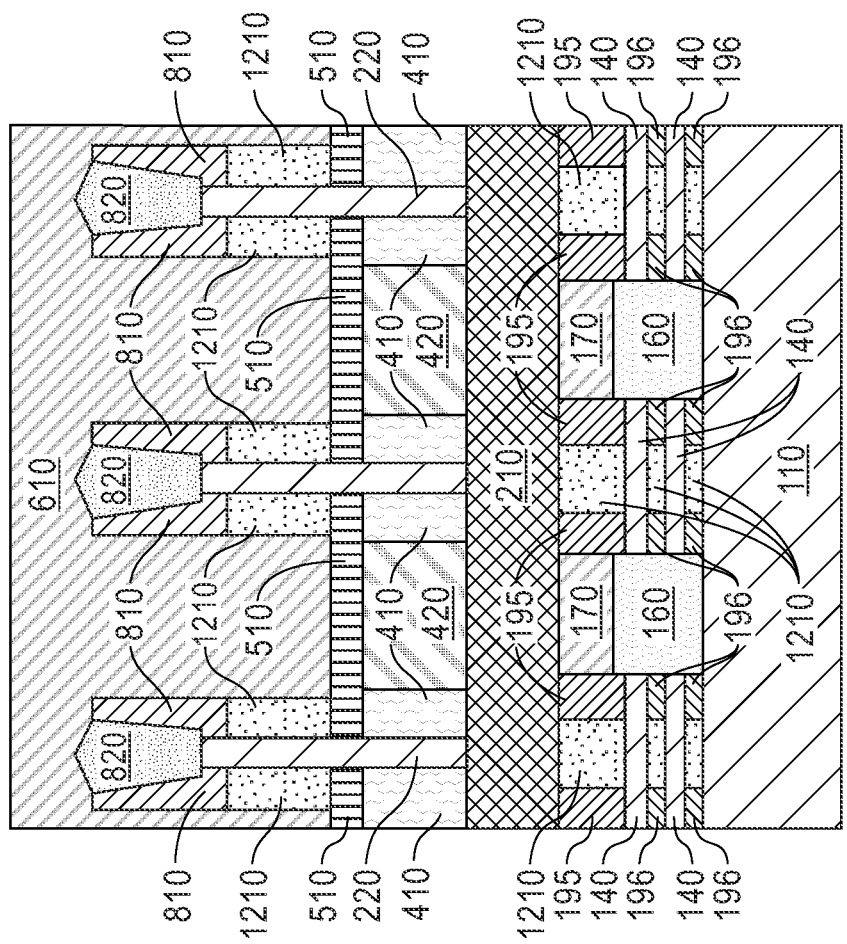
FIG. 12B depicts a cross-sectional view, along section line B of FIG. 12A.

FIG. 12A depicts a top-down view of fabrication steps, in accordance with an embodiment of the present invention. FIG. 12B depicts a cross-sectional view along section line B of FIG. 12A and FIG. 12C depicts a cross-sectional view along section line C of FIG. 12A, in accordance with an embodiment of the present invention. FIGS. 12A-12C depict the formation of a gate structure for both the bottom horizontal FET and the top vertical FET and a corresponding gate contact for both FETs.

Functional gate structures are formed in each gate cavity. For the bottom horizontal FET, the functional gate structure surrounds a physically exposed surface of each semiconductor channel material nanosheet (i.e., semiconductor channel material layer 140). By "functional gate structure" it is meant a permanent gate structure used to control output current (i.e., flow of carriers in the channel) of a semiconducting device through electrical or magnetic fields. For the upper vertical FET, the functional gate structure surrounds portions of semiconductor layer 220. The contact trench previously described may also be filled with the same material as the functional gate structures, providing a gate contact for both the bottom horizontal FET and the upper vertical FET. Collectively, both gate structures and the gate contact are referred to as Gate conductor 1210 in the Figures.

While not depicted, in some embodiments, a gate dielectric portion may be present that includes a gate dielectric material. Such a gate dielectric portion may be an oxide, nitride, and/or oxynitride. In one example, the gate dielectric portion can be a high-κ material having a dielectric constant greater than silicon dioxide. Example high-κ dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multi-layered gate dielectric structure comprising different gate dielectric materials, e.g., silicon dioxide, and a high-κ gate dielectric, can be formed and used as the gate dielectric portion.

The gate dielectric material used in providing a gate dielectric portion can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing a gate dielectric portion can have a thickness in a range from 1 nm to 10 nm. Other thicknesses that are lesser than, or greater than, the aforementioned thickness range can also be employed for the gate dielectric material that may provide a gate dielectric portion.

Gate conductor 1210 can include a gate conductor material. The gate conductor material used in providing gate conductor 1210 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide), or multilayered combinations thereof. In one embodiment, gate conductor 1210 may comprise an nFET gate metal. In another embodiment, gate conductor 1210 may comprise a pFET gate metal. When multiple gate cavities are formed, it is possible to form a nFET in a first set of the gate cavities and wrapping around some of the semiconductor channel material nanosheet (i.e., semiconductor channel material layer 140) and a pFET in a second set of the gate cavities and wrapping around some of the semiconductor channel material nanosheet (i.e., semiconductor channel material layer 140).

The gate conductor material used in providing gate conductor 1210 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing gate conductor 1210 can have a thickness from 5 nm to 200 nm. Other thicknesses that are lesser than, or greater than, the aforementioned thickness range can also be employed for the gate conductor material used in providing gate conductor 1210.

A functional gate structure (gate conductor 1210, gate dielectric portion) can be formed by providing a functional gate material stack of the gate dielectric material, and the gate conductor 1210 material. A planarization process may follow the formation of the functional gate material stack.

Figure 13A:
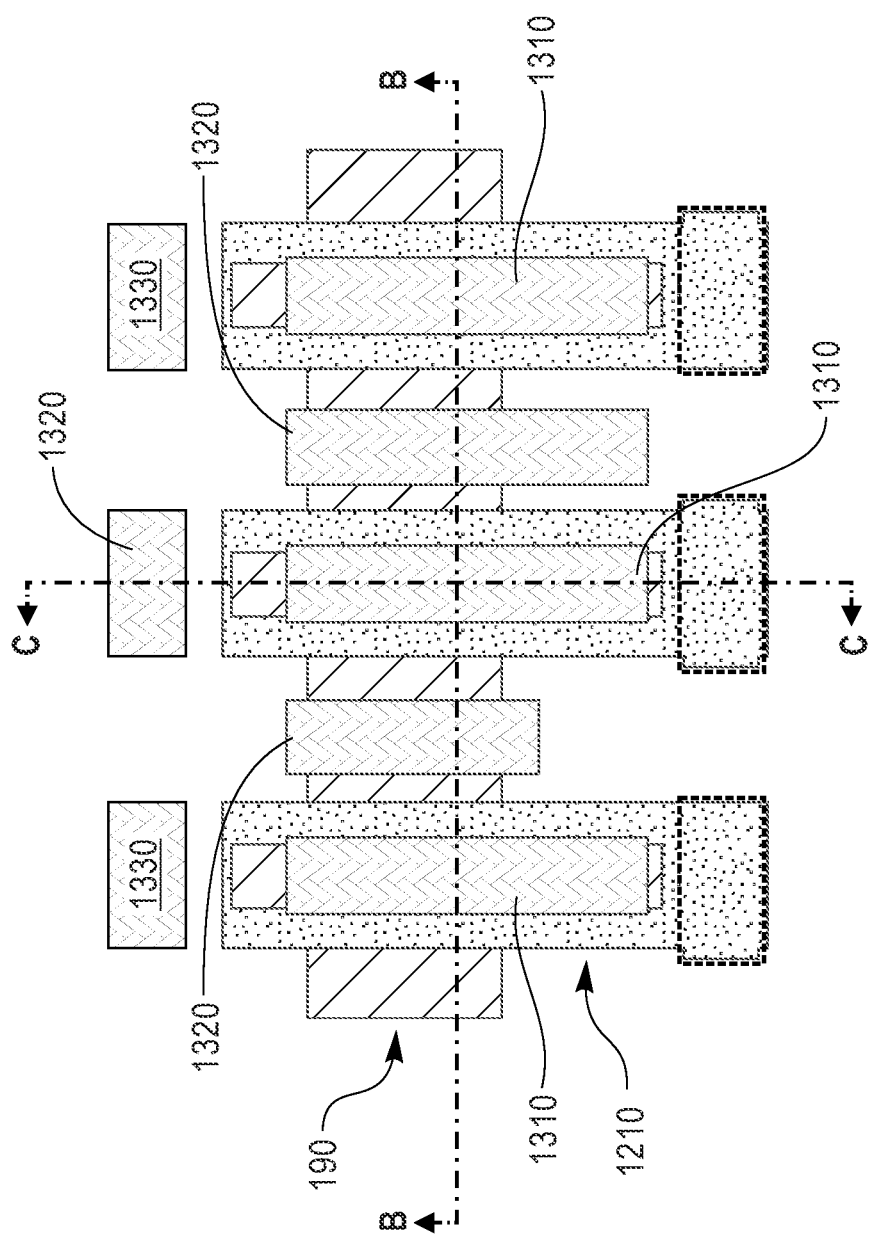
FIG. 13A depicts a top-down view.

FIG. 13A depicts a top-down view of fabrication steps, in accordance with an embodiment of the present invention. FIG. 13B depicts a cross-sectional view along section line B of FIG. 13A and FIG. 13C depicts a cross-sectional view along section line C of FIG. 13A, in accordance with an embodiment of the present invention. FIGS. 13A-13C depict the formation of VTFET top source/drain contacts 1310, bottom FET source/drain contacts 1320, and VTFET bottom source/drain contacts 1330.

In general, source/drain contacts 1310 make contact with the top source/drain region 820 of VTFET, source/drain contacts 1320 make contact with source/drain region 160 of the bottom FET, and source/drain contacts 1330 make contact with bottom source/drain region 410 of the VTFET.

One or more trenches may be formed by lithography and an etching process, such as reactive-ion etching (RIE), laser ablation, or any etch process which can be used to selectively remove a portion of material such as ILD material 610, bottom spacer 510, STI material 420, bonding oxide 210, and/or ILD material 170. A hardmask (not shown) may be patterned using photoresist to expose areas of the device where trenches are desired and the hardmask may be utilized during the etching process in the creation of the trenches. The etching process only removes portions of the device not protected by the hardmask and the etching process stops at top source/drain region 820, bottom source/drain region 410, or source/drain region 160.

In some embodiments, subsequent to the formation of the trenches, the hardmask is removed. In general, the process of removing the hardmask involves the use of an etching process such as RIE, laser ablation, or any etch process which can be used to selectively remove a portion of material, such as the hardmask. In some embodiments, prior to the removal of the hardmask, the photoresist (not shown) is removed. The process of removing the photoresist is similar to that of the process of removing the hardmask.

Source/drain contacts 1310, source/drain contacts 1320, and source/drain contacts 1330 may each be formed by metal deposition and planarization. The metal layers comprise a silicide liner, such as, for example, Ti, Ni, or NiPt, followed by adhesion metal liner, such as, for example, TiN, and a conductive metal fill, such as, for example, Co, Ru, W, or Cu.

Each source/drain contacts 1310, source/drain contacts 1320, and source/drain contacts 1330 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes.

Due to the particular arrangement shown in the Figures, source/drain contacts 1320 are able to proceed from a top surface of the device to a topmost surface of source/drain region 160 of the bottom FET without interfering with the vertical FET present above the horizontal FET that includes source/drain region 160.

Figure 14A:
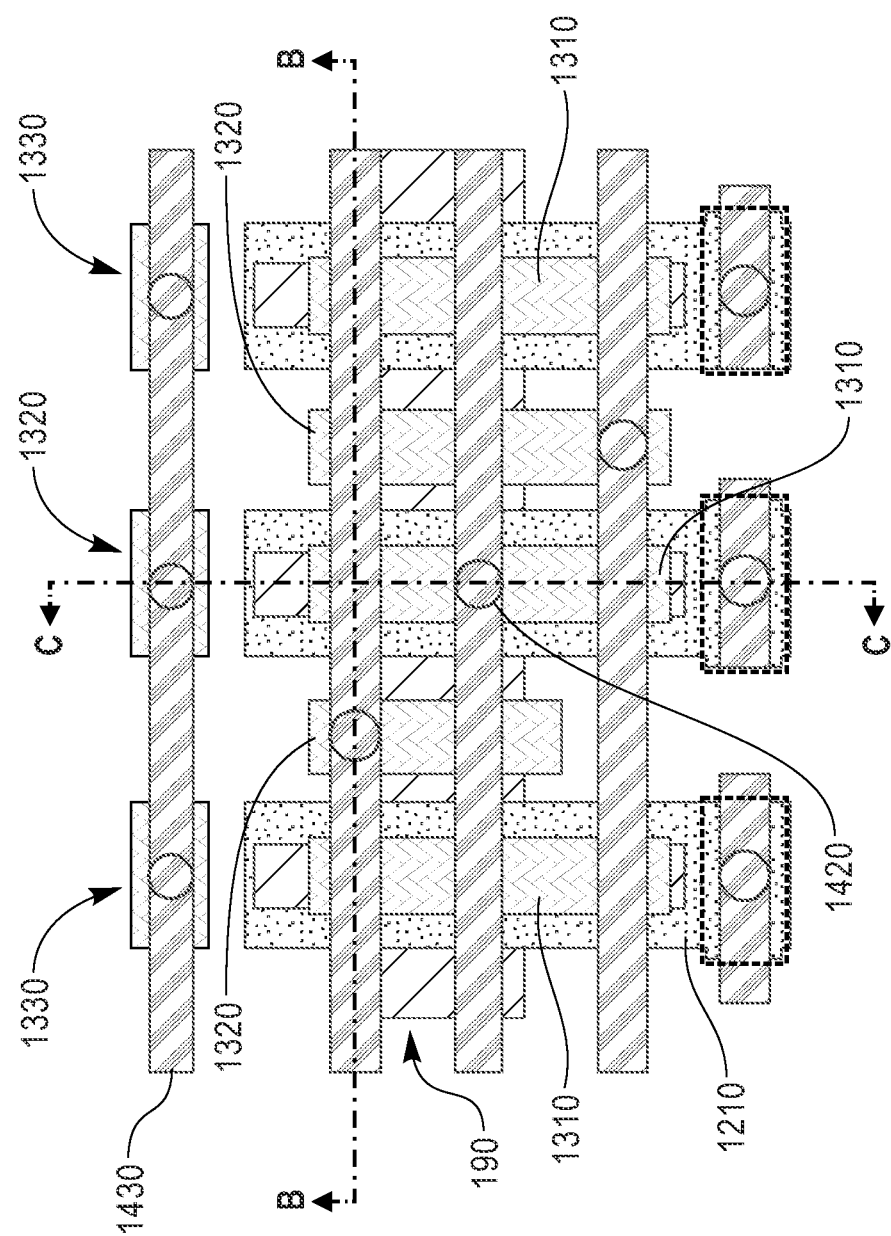
FIG. 14A depicts a top-down view.
Figure 14C:
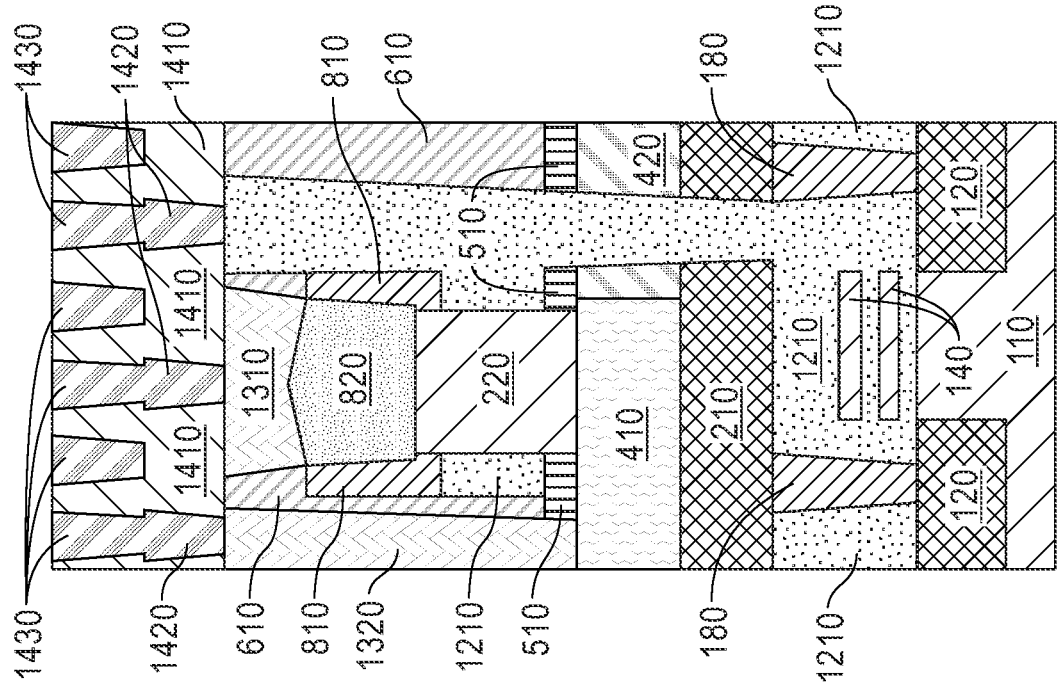
FIG. 14C depicts a cross-sectional view, along section line C of FIG. 14A, of a process of forming vias and metal lines in ILD material, in accordance with an embodiment of the present invention.
Figure 14B:
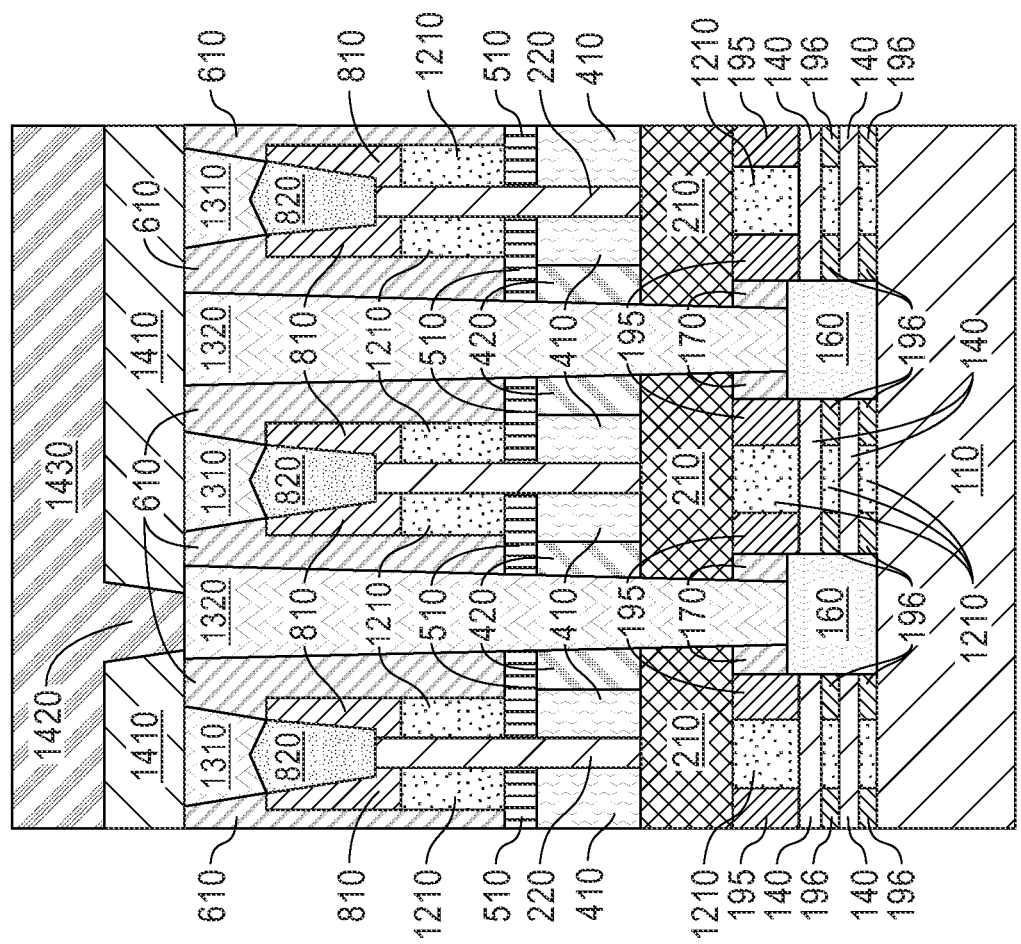
FIG. 14B depicts a cross-sectional view, along section line B of FIG. 14A.

FIG. 14A depicts a top-down view of fabrication steps, in accordance with an embodiment of the present invention. FIG. 14B depicts a cross-sectional view along section line B of FIG. 14A and FIG. 14C depicts a cross-sectional view along section line C of FIG. 14A, in accordance with an embodiment of the present invention. FIGS. 14A-14C depict the formation of back end of line (BEOL) features such as vias 1420 and metal lines 1430 in ILD material 1410.

A first portion of ILD material 1410 may be formed on exposed top surfaces of the device of a height corresponding to a desired height of vias 1420.

ILD material 1410 may be composed of silicon dioxide, undoped silicate glass (USG), fluorosilicate glass (FSG), borophosphosilicate glass (BPSG), a spin-on low-κ dielectric layer, a chemical vapor deposition (CVD) low-κ dielectric layer or any combination thereof. The term "low-κ" as used throughout the present application denotes a dielectric material that has a dielectric constant of less than silicon dioxide. In another embodiment, a self-planarizing material such as a spin-on glass (SOG) or a spin-on low-κ dielectric material such as SiLK™ can be used as ILD material 1410. The use of a self-planarizing dielectric material as ILD material 1410 may avoid the need to perform a subsequent planarizing step.

In one embodiment, ILD material 1410 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as ILD material 1410, a planarization process or an etch back process follows the deposition of the dielectric material that provides ILD material 1410.

The metal lines 1430 and via 1420 can be patterned by conventional lithography and etching process, and can be filled by conventional damascene process. Examples of metal fill materials include a thin adhesion liner, such as, for example, TiN or TaN, followed by conductive metal fill material, such as, for example, Cu, Co, or Ru.

The resulting structure is a semiconductor device that comprises a vertical transistor stacked above a horizontal transistor such that a single gate contact makes contact with both the gate of the horizontal transistor and the vertical transistor and each source/drain region of the two stacked transistors are horizontally staggered such that contacts can directly land over each of the source/drain regions for both the lower horizontal transistor and the upper vertical transistor.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
    a horizontally-oriented field-effect transistor (FET) comprising horizontally-oriented source/drain regions; and
    a vertically-oriented FET, the vertically-oriented FET:
        stacked above the horizontally-oriented field-effect transistor; and
        comprising vertically-oriented source/drain regions stacked above the horizontally-oriented source/drain regions.

2. The semiconductor structure of claim 1, wherein the horizontally-oriented source/drain regions are laterally adjacent to the vertically-oriented source/drain regions such that vertical overlap between the horizontally-oriented source/drain regions and the vertically-oriented source/drain regions is not present.

3. The semiconductor structure of claim 2, further comprising, a plurality of contacts, each contact contacting a single source/drain region of the vertically-oriented source/drain regions and the horizontally-oriented source/drain regions.

4. The semiconductor structure of claim 1, further comprising a single contact contacting both: a first gate of the horizontally-oriented FET and a second gate of the vertically-oriented FET.

5. The semiconductor structure of claim 4, wherein the gate of the horizontally-oriented FET and the gate of the vertically-oriented FET each comprises (i) a gate dielectric portion physically contacting a channel and (ii) a gate conductor portion physically contacting the gate dielectric portion.

6. The semiconductor structure of claim 1, further comprising a bonding oxide between the horizontally-oriented FET and the vertically-oriented FET.

7. The semiconductor structure of claim 1, wherein the horizontally-oriented FET comprises:
    a plurality of stacked and suspended semiconductor channel material nanosheets located above a semiconductor substrate;
    a functional gate structure surrounding a portion of each semiconductor channel material nanosheet of the plurality of stacked and suspended semiconductor channel material nanosheets; and
    a source/drain region, of the horizontally-oriented source/drain regions, on each side of the functional gate structure and physically contacting sidewalls of each semiconductor channel material nanosheet of the plurality of stacked and suspended semiconductor channel material nanosheets.

8. The semiconductor structure of claim 7, wherein the horizontally-oriented FET further comprises spacers contacting sidewalls of the functional gate structure and located on an outer portion of each semiconductor material nanosheet of the plurality of stacked and suspended semiconductor channel material nanosheets.

9. The semiconductor structure of claim 7, wherein the horizontally-oriented FET further comprises sidewalls of each semiconductor channel material nanosheet, of the plurality of stacked and suspended semiconductor channel material nanosheets, that are vertically aligned to one another.

10. The semiconductor structure of claim 1, wherein the vertically-oriented FET comprises:
    a bottom source/drain region, of the vertically-oriented source/drain regions, surrounding a first portion of a semiconductor material channel;
    a functional gate structure surrounding a second portion of the semiconductor material channel, the functional gate structure above the bottom source/drain region; and
    a top source/drain region, of the vertically-oriented source/drain regions, contacting a top surface of the semiconductor material channel.

* * * * *